US012805396B2

(12) United States Patent
Wu et al.

(10) Patent No.: US 12,805,396 B2
(45) Date of Patent: Nov. 17, 2026

(54) DISPLAY PANEL

(71) Applicant: AUO Corporation, Hsin-Chu (TW)

(72) Inventors: Yang-En Wu, Hsin-Chu (TW); Chieh-Ming Chen, Hsin-Chu (TW); Bo-Ru Jian, Hsin-Chu (TW); Kuo-Hsuan Huang, Hsin-Chu (TW); Ta-Wen Liao, Hsin-Chu (TW); Yu-Chin Wu, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 404 days.

(21) Appl. No.: 18/396,809

(22) Filed: Dec. 27, 2023

(65) Prior Publication Data

US 2025/0087650 A1 Mar. 13, 2025

(30) Foreign Application Priority Data

Sep. 12, 2023 (TW) ................................ 112134737

(51) Int. Cl.

*H10W 90/00* (2026.01)
*H10H 20/856* (2025.01)
*H10H 20/857* (2025.01)

(52) U.S. Cl.

CPC .......... *H10W 90/00* (2026.01); *H10H 20/856* (2025.01); *H10H 20/857* (2025.01)

(58) Field of Classification Search

CPC ... H10W 90/00; H10H 20/854; H10H 20/856; H10H 20/857; H10H 29/142; H10H 29/49; H10H 29/8421

See application file for complete search history.

(56) References Cited

U.S. PATENT DOCUMENTS

| | | | | |
|---|---|---|---|---|
| 2010/0102335 A1* | 4/2010 | Takagi | ................. | H10K 59/131 257/40 |
| 2017/0263821 A1* | 9/2017 | In | ......................... | H10H 20/816 |
| 2020/0043906 A1 | 2/2020 | Kuo et al. | | |

FOREIGN PATENT DOCUMENTS

| | | |
|---|---|---|
| CN | 106684108 A | 5/2017 |
| CN | 107403818 A | 11/2017 |

(Continued)

OTHER PUBLICATIONS

Office Action issued by (TIPO) Taiwan Intellectual Property Office Ministry of Economic Affairs R.O.C., August 7, 2024, for Application No. 112134737, Taiwan.

*Primary Examiner* — Hoai V Pham

(74) *Attorney, Agent, or Firm* — Tim Tingkang Xia, Esq.; Troutman Pepper Locke LLP

(57) ABSTRACT

A display panel includes a driving backplane, a light emitting component, a reflective structure and a bridging component. The driving backplane has a first pad and a second pad separated from each other. The light emitting component has a first electrode and a second electrode. The first electrode is electrically connected to the first pad of the driving backplane, and the first electrode is located between the second electrode and the first pad of the driving backplane. The reflective structure is disposed on the driving backplane and located at a periphery of the light emitting component. The bridging component is disposed on the light emitting component. One end of the bridging component is electrically connected to the second electrode. The bridging component passes across at least one portion of the reflective structure. The other end of the bridging component is electrically connected to the second pad of the driving backplane.

17 Claims, 31 Drawing Sheets

(56) References Cited

FOREIGN PATENT DOCUMENTS

| | | | |
|---|---|---|---|
| CN | 107680960 | A | 2/2018 |
| CN | 207529965 | U | 6/2018 |
| CN | 110970546 | A | 4/2020 |
| CN | 112635452 | A | 4/2021 |
| CN | 112786760 | A | 5/2021 |
| CN | 113451350 | A | 9/2021 |
| CN | 114280847 | A | 4/2022 |

* cited by examiner

DISPLAY PANEL

CROSS-REFERENCE TO RELATED PATENT APPLICATION

This non-provisional application claims priority to and the benefit of, pursuant to 35 U.S.C. § 119 (a), patent application No. 112134737 filed in Taiwan on Sep. 12, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to an optoelectronic device, and particularly to a display panel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A light emitting diode (LED) display apparatus includes a driving backplane and a plurality of LED components transposed on the driving backplane. Inheriting the characteristics of the LED, the LED display apparatus has the advantages such as saving power, high efficiency, high brightness and fast response time. In addition, compared to the organic LED (OLED) display apparatus, the LED display apparatus further has the advantages such as easy color adjustment, long luminous life and no image burn-in. Thus, the LED display apparatus are considered the next generation of display technology.

Generally, the LED components may be categorized as a horizontal LED component and a vertical LED component. A plurality of electrodes of the horizontal LED component are located at the same side of its active layer. A plurality of electrodes of the vertical LED component are located at two opposite sides of its active layer. Compared to the horizontal LED component, the vertical LED component has the advantage of a small volume, which is more suitable in the application to the display panel with a high resolution. However, due to the limited innate structure, the light shape emitted by the vertical LED component is relatively divergent, thereby affect the brightness of the display panel using the vertical LED component.

SUMMARY

The present disclosure provides a display panel with high brightness.

The display panel according to certain embodiments of the present disclosure includes a driving backplane, a light emitting component, a reflective structure and a bridging component. The driving backplane has a first pad and a second pad separated from each other. The light emitting component has a first electrode and a second electrode. The first electrode of the light emitting component is electrically connected to the first pad of the driving backplane, and the first electrode of the light emitting component is located between the second electrode of the light emitting component and the first pad of the driving backplane. The reflective structure is disposed on the driving backplane and located at a periphery of the light emitting component. The bridging component is disposed on the light emitting component. One end of the bridging component is electrically connected to the second electrode of the light emitting component. The bridging component passes across at least one portion of the reflective structure. The other end of the bridging component is electrically connected to the second pad of the driving backplane.

In one embodiment of the present disclosure, the light emitting component has a peripheral surface located between the first electrode and the second electrode, and the reflective structure is disposed on the first pad of the driving backplane and covers at least one portion of the peripheral surface of the light emitting component.

In one embodiment of the present disclosure, the reflective structure directly contacts the peripheral surface of the light emitting component.

In one embodiment of the present disclosure, the reflective structure has a first opening overlapping with the light emitting component.

In one embodiment of the present disclosure, the reflective structure has a surface facing away from the driving backplane, the second electrode of the light emitting component has a surface facing away from the driving backplane, a first direction is substantially perpendicular to the driving backplane, and a distance between the surface of the reflective structure and the first pad in the first direction is less than a distance between the surface of the second electrode of the light emitting component and the first pad in the first direction.

In one embodiment of the present disclosure, the display panel further includes an insulating layer, disposed on the driving backplane, and having a first opening overlapping with the first pad, wherein a portion of the reflective structure is disposed in the first opening of the insulating layer.

In one embodiment of the present disclosure, a second direction is substantially parallel to the driving backplane, and a width of the reflective structure in the second direction is greater than or equal to a width of the first opening of the insulating layer in the second direction.

In one embodiment of the present disclosure, the reflective structure includes a main portion and an auxiliary portion. The main portion is disposed on the peripheral surface of the light emitting component. The main portion has a peripheral surface located around the light emitting component. The auxiliary portion is disposed on the peripheral surface of the main portion, and a material of the main portion is different from a material of the auxiliary portion.

In one embodiment of the present disclosure, the display panel further includes an insulating layer, disposed on the driving backplane, and having a first opening overlapping with the first pad and a body defining the first opening. The reflective structure is disposed in the first opening of the insulating layer and on the body of the insulating layer, and the bridging component is directly disposed on the reflective structure.

In one embodiment of the present disclosure, the reflective structure has a second opening overlapping with the second pad, and the other end of the bridging component is filled in the second opening of the reflective structure to be electrically connected to the second pad.

In one embodiment of the present disclosure, the display panel further includes a flat layer. The reflective structure has a peripheral surface located around the light emitting component, and the flat layer covers at least one portion of the peripheral surface of the reflective structure.

In one embodiment of the present disclosure, the reflective structure has a first opening overlapping with the first pad and the light emitting component. The display panel further includes a flat layer, disposed on the reflective structure, and filled in the first opening of the reflective structure.

In one embodiment of the present disclosure, the light emitting component has a peripheral surface located between the first electrode and the second electrode, and the flat layer directly contacts the peripheral surface of the light emitting component.

In one embodiment of the present disclosure, the flat layer has a first opening overlapping with the light emitting component.

In one embodiment of the present disclosure, the display panel further includes an insulating layer, disposed on the driving backplane, and having a first opening overlapping with the first pad. The reflective structure is disposed between the flat layer and the insulating layer, a second direction is substantially parallel to the driving backplane, and a width of the first opening of the reflective structure in the second direction is greater than a width of the first opening of the insulating layer in the second direction.

In one embodiment of the present disclosure, the reflective structure includes a main portion and an auxiliary portion. The main portion is disposed on the insulating layer. The main portion has a peripheral surface located around the light emitting component. The auxiliary portion is disposed on the peripheral surface of the main portion, and a material of the main portion is different from a material of the auxiliary portion.

In one embodiment of the present disclosure, the reflective structure has a second opening overlapping with the second pad, the flat layer has a second opening, the second opening of the flat layer is located in the second opening of the reflective structure, and the other end of the bridging component is filled in the second opening of the flat layer to be electrically connected to the second pad.

These and other aspects of the present disclosure will become apparent from the following description of the embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1A:
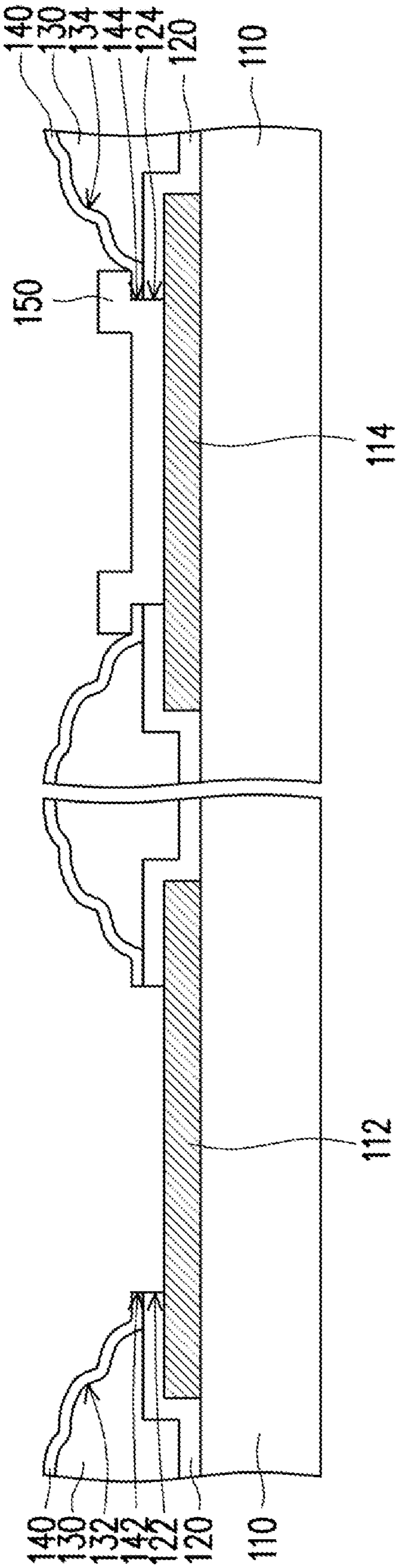
FIG. 1A to FIG. 1D are sectional schematic views of a manufacturing process of a display panel according to a first embodiment of the present disclosure.

The present disclosure will now be described hereinafter in details with reference to the accompanying drawings, in which exemplary embodiments of the disclosure are shown. Whenever possible, identical reference numerals refer to identical or like elements in the drawings and descriptions.

It should be understood that when one component such as a layer, a film, a region or a substrate is referred to as being disposed "on" the other component or "connected to" the other component, the component may be directly disposed on the other component or connected to the other component, or an intermediate component may also exist between the two components. In contrast, when one component is referred to as being "directly disposed on the other component" or "directly connected to" the other component, no intermediate component exists therebetween. As used herein, a "connection" may be a physical and/or electrical connection. In addition, when two components are "electrically connected" or "coupled", other components may exist between the two components.

The terms "about", "approximately" or "substantially" as used herein shall cover the values described, and cover an average value of an acceptable deviation range of the specific values ascertained by one of ordinary skill in the art, where the deviation range may be determined by the measurement described and specific quantities of errors related to the measurement (that is, the limitations of the measuring system). For example, the term "about" represents within one or more standard deviations of a given value of range, such as within ±30 percent, within ±20 percent, within ±10 percent or within ±5 percent. Moreover, the terms "about", "approximately" or "substantially" as used herein may selectively refer to a more acceptable deviation range or the standard deviation based on the optical characteristics, the etching characteristic or other characteristics, without applying one standard deviation to all characteristics.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1A to FIG. 1D are sectional schematic views of a manufacturing process of a display panel according to a first embodiment of the present disclosure.

Referring to FIG. 1A, firstly, a driving backplane 110 is provided, where the driving backplane 110 has a first pad 112 and a second pad 114 separated from each other. In detail, in one embodiment, the driving backplane 110 may include a supporting substrate (not illustrated) and a pixel driving circuit (not illustrated) disposed on the supporting substrate, and the first pad 112 and the second pad 114 are electrically connected to different ends of the pixel driving circuit respectively.

Subsequently, in one embodiment, an insulating layer 120 and, optionally, a flat layer 130 and a shielding protective layer 140 may be formed on the driving backplane 110. The insulating layer 120 is disposed on the driving backplane 110 and has a first opening 122 and a second opening 124. The first opening 122 and the second opening 124 of the insulating layer 120 respectively overlap with the first pad 112 and the second pad 114. The flat layer 130 is disposed on the insulating layer 120 and has a first opening 132 and a second opening 134. The first opening 132 and the second opening 134 of the flat layer 130 respectively overlap with the first opening 122 and the second opening 124 of the insulating layer 120. The shielding protective layer 140 is disposed on the flat layer 130 and has a first opening 142 and a second opening 144. The first opening 142 and the second opening 144 of the shielding protective layer 140 respectively overlap with the first opening 122 and the second opening 124 of the insulating layer 120.

In one embodiment, the material of the insulating layer 120 may be an inorganic material (such as silicon oxide, silicon nitride, silicon oxynitride, or a stacked layer of at least two thereof), an organic material or a combination thereof. In one embodiment, the material of the flat layer 130 may be an inorganic material (such as silicon oxide, silicon nitride, silicon oxynitride, or a stacked layer of at least two thereof), an organic material or a combination thereof. In one embodiment, the material of the shielding protective layer 140 may be an inorganic material (such as silicon oxide, silicon nitride, silicon oxynitride, or a stacked layer of at least two thereof), an organic material or a combination thereof.

Subsequently, in one embodiment, a metal oxide pattern 150 may be optionally formed on the shielding protective layer 140 to cover a portion of the second pad 114 exposed by the second opening 144 of the shielding protective layer 140 and the second opening 124 of the insulating layer 120. The metal oxide pattern 150 is used to protect the second pad 114. In one embodiment, the material of the metal oxide pattern 150 is indium tin oxide, indium zinc oxide, aluminum tin oxide, aluminum zinc oxide, indium germanium zinc oxide, other suitable oxides, or a stacked layer of at least two thereof, but the present disclosure is not limited thereto.

Figure 1B:
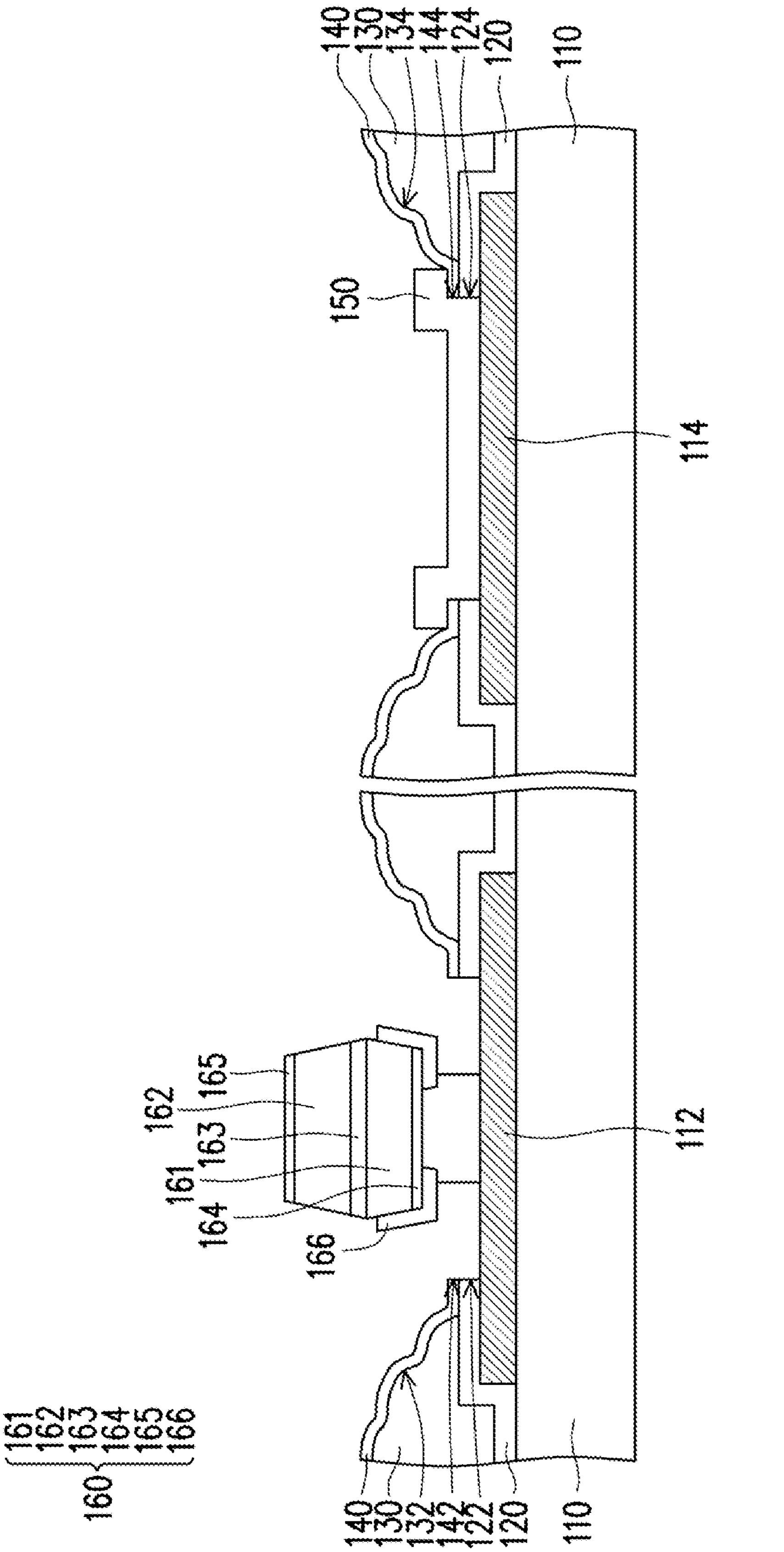

Referring to FIG. 1B, subsequently, the light emitting component 160 is transferred onto the driving backplane 110, and the light emitting component 160 is electrically connected to the driving backplane 110. The light emitting component 160 includes a first semiconductor layer 161, a second semiconductor layer 162, an active layer 163 disposed between the first semiconductor layer 161 and the second semiconductor layer 162, a first electrode 164 electrically connected to the first semiconductor layer 161 and a second electrode 165 electrically connected to the second semiconductor layer 162. The first electrode 164 and the second electrode 165 of the light emitting component 160 are respectively located at two opposite sides of the active layer 163. The light emitting component 160 is a vertical light emitting diode (LED). The first electrode 164 of the light emitting component 160 is electrically connected to the first pad 112 of the driving backplane 110, and the first electrode 164 of the light emitting component 160 is located between the second electrode 165 of the light emitting component 160 and the first pad 112 of the driving backplane 110. The light emitting component 160 is disposed on the first pad 112 and overlaps with the first opening 122 of the insulating layer 120. In one embodiment, the light emitting component 160 further overlaps with the first opening 132 of the flat layer 130 and the first opening 142 of the shielding protective layer 140.

The light emitting component 160 has a peripheral surface 160*a* located between the first electrode 164 and the second electrode 165. In one embodiment, the light emitting component 160 further includes an insulating layer 166. The insulating layer 166 covers a side wall of the first semiconductor layer 161, a side wall of the second semiconductor layer 162 and/or a side wall of the active layer 163, and has an outer surface facing away from the side wall of the first semiconductor layer 161, the side wall of the second semiconductor layer 162 and/or the side wall of the active layer 163. The peripheral surface 160*a* may include the side wall of the first semiconductor layer 161, the side wall of the second semiconductor layer 162, the side wall of the active layer 163 and/or the outer surface of the insulating layer 166.

Figure 1C:
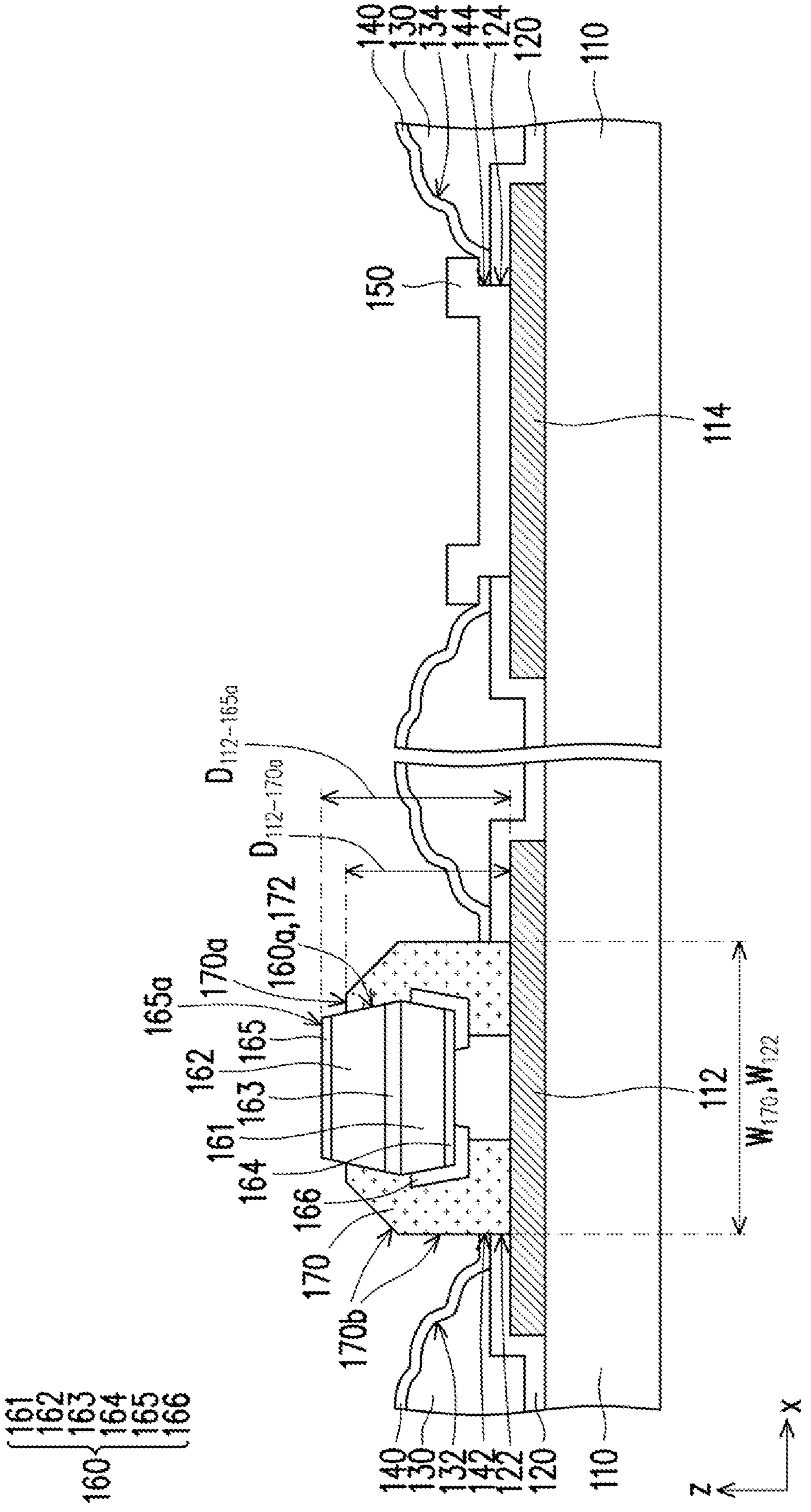

Referring to FIG. 1C, subsequently, a reflective structure 170 is formed on the driving backplane 110. The reflective structure 170 is disposed on the driving backplane 110, and is located at a periphery of the light emitting component 160. It should be noted that a portion of the light beam (not illustrated) emitted by the light emitting component 160 may be transmitted toward the peripheral surface 160*a* of the light emitting component 160, and the reflective structure 170 may guide the light beam transmitted toward the peripheral surface 160*a* to a side where the second electrode 165 is located. Thus, the light beam emitted by the light emitting component 160 may concentrate toward a normal direction (that is, the first direction z), and the light shape of the light emitting component 160 is adjusted, thereby enhancing the brightness thereof. In addition, the reflective structure 170 used to adjust the light shape may be manufactured using the existing manufacturing device, without the need to additionally purchase devices.

In one embodiment, the reflective structure 170 is disposed on the first pad 112 and may optionally cover at least one portion of the peripheral surface 160*a* of the light emitting component 160. In one embodiment, the reflective structure 170 may directly contact the peripheral surface 160*a* of the light emitting component 160. In one embodiment, the reflective structure 170 may have a first opening 172 overlapping with the light emitting component 160. In one embodiment, a portion of the reflective structure 170 may be disposed in the first opening 122 of the insulating layer 120. In one embodiment, the reflective structure 170 may directly contact the first pad 112.

In one embodiment, the reflective structure 170 has a surface 170*a* facing away from the driving backplane 110, and the second electrode 165 of the light emitting component 160 has a surface 165*a* facing away from the driving backplane 110. The first direction z is substantially perpendicular to the driving backplane 110, and a distance $D_{112-}$ $_{170a}$ between the surface 170*a* of the reflective structure 170 and the first pad 112 in the first direction z is less than a distance $D_{112\text{-}165a}$ between the surface 165*a* of the second electrode 165 and the first pad 112 in the first direction z. In other words, in one embodiment, the reflective structure 170 covers the light emitting component 160 but is not higher than the second electrode 165 of the light emitting component 160, and the reflective structure 170 may expose the second electrode 165, thus allowing the second electrode 165 to be electrically connected to the second pad 114 of the driving backplane 110 in the subsequent manufacturing process.

In one embodiment, a second direction x is substantially parallel to the driving backplane 110, and a width $W_{170}$ of the reflective structure 170 in the second direction x is greater than or equal to a width $W_{122}$ of the first opening 122 of the insulating layer 120 in the second direction x. In other words, in one embodiment, the reflective structure 170 may fully occupy the first opening 122 of the insulating layer 120 exposing the first pad 112. Thus, even though the light emitting component 160 deviates when being transferred to the driving backplane 110, since the reflective structure 170 is sufficiently wide, the reflective structure 170 may still well cover the light emitting component 160, thereby achieving good light shape adjustment and brightness enhancement effects.

The reflective structure 170 has high reflectivity. For example, in one embodiment, the reflectivity of the reflective structure 170 at the wavelength of 450 nm may be greater than 50%. Preferably, the reflectivity of the reflective structure 170 at the wavelength of 450 nm may be greater than 70%, but the present disclosure is not limited thereto.

In one embodiment, the reflective structure 170 may be optionally white, but the present disclosure is not limited thereto. In one embodiment, the material of the reflective structure 170 may include an organic material, an inorganic material, a metal or a combination thereof, but the present disclosure is not limited thereto.

In one embodiment, the reflective structure 170 has a peripheral surface 170*b* located around the light emitting component 160. In one embodiment, the peripheral surface 170*b* may include a plurality of sub-surfaces with different slopes. However, the present disclosure is not limited thereto, and the quantity and the slopes of the sub-surfaces of the peripheral surface 170*b* may be adjusted based on the need of the actual light shapes.

Figure 1D:
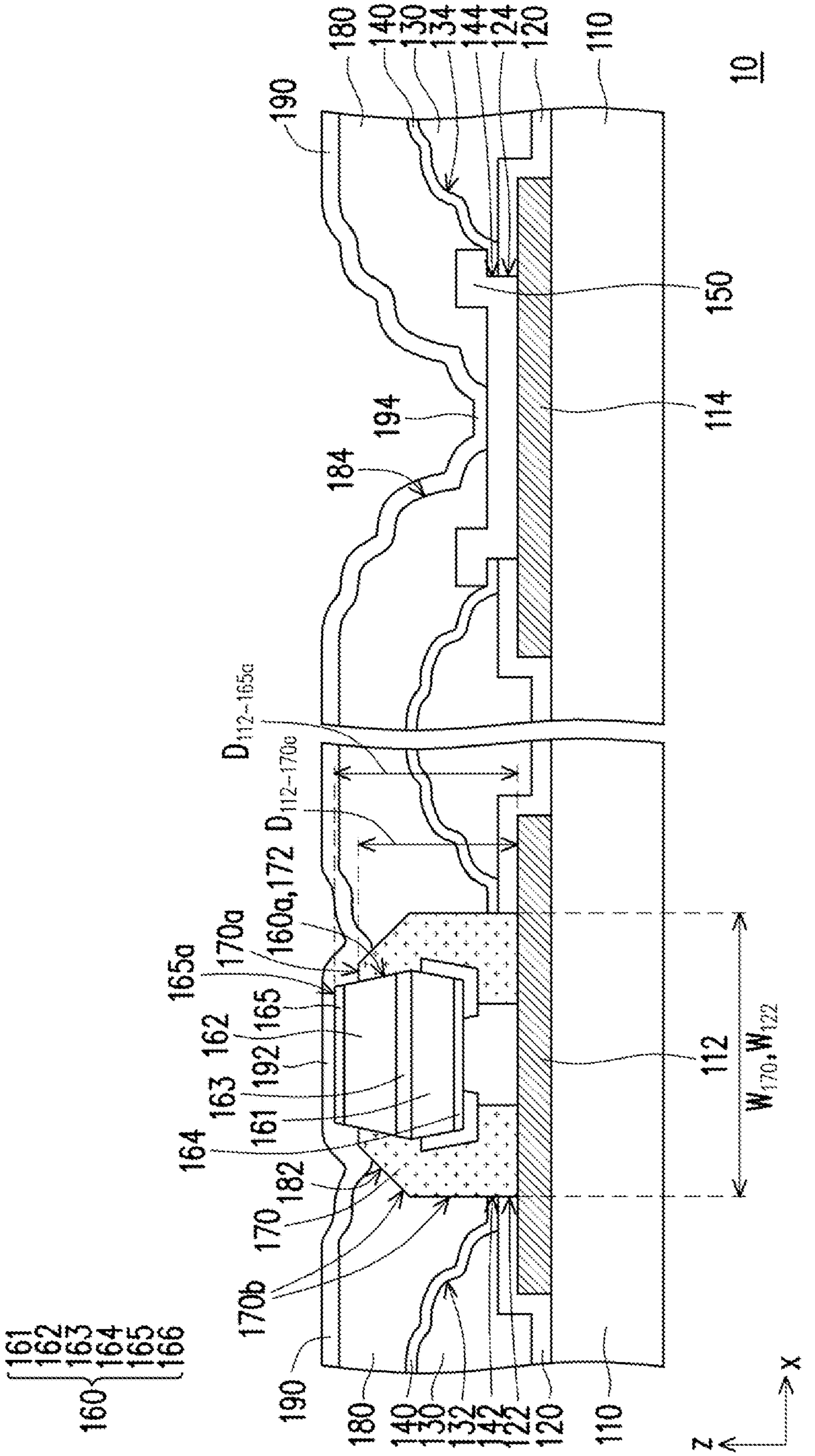

Referring to FIG. 1D, subsequently, in one embodiment, a flat layer 180 may be formed on the driving backplane 110 to cover the shielding protective layer 140 and at least one portion of the peripheral surface 170*b* of the reflective structure 170. In one embodiment, the flat layer 180 has a first opening 182 overlapping with the reflective structure 170. In one embodiment, the flat layer 180 has a second opening 184 overlapping with the second pad 114. In one embodiment, the second opening 184 of the flat layer 180 exposes a portion of the metal oxide pattern 150. In one embodiment, the material of the flat layer 180 may be an inorganic material (such as silicon oxide, silicon nitride, silicon oxynitride, or a stacked layer of at least two thereof), an organic material or a combination thereof.

Referring to FIG. 1D, subsequently, in one embodiment, a bridging component 190 may be formed on the flat layer 180 and the light emitting component 160. The bridging component 190 is disposed on the flat layer 180 and the light emitting component 160. One end 192 of the bridging component 190 is electrically connected to the second electrode 165 of the light emitting component 160, the bridging component 190 passes across at least one portion of the reflective structure 170, and the other end 194 of the bridging component 190 is filled in the second opening 184 of the flat layer 180 to be electrically connected to the second pad 114 of the driving backplane 110 through the metal oxide pattern 150, thus completing the display panel 10. In one embodiment, the bridging component 190 is, for example, a transparent conductive layer, which includes a metal oxide, such as indium tin oxide, indium zinc oxide, aluminum tin oxide, aluminum zinc oxide, indium germanium zinc oxide, other suitable oxides, or a stacked layer of at least two thereof, but the present disclosure is not limited thereto.

It should be noted herein that the following embodiment uses the reference numerals and certain contents of the aforementioned embodiment, in which identical or similar components are identified by identical reference numerals, and descriptions of the identical technical contents will be omitted. The omitted descriptions may be referenced to in the aforementioned embodiment, and are not hereinafter reiterated in the following embodiments.

FIG. 2A to FIG. 2E are sectional schematic views of a manufacturing process of a display panel according to a second embodiment of the present disclosure. The display panel 10A and the manufacturing process thereof in the second embodiment are similar to the display panel 10 and the manufacturing process thereof in the first embodiment, and the difference between the two exists in that the reflective structure 170A in the second embodiment is different from the reflective structure 170 in the first embodiment.

Figure 2A:
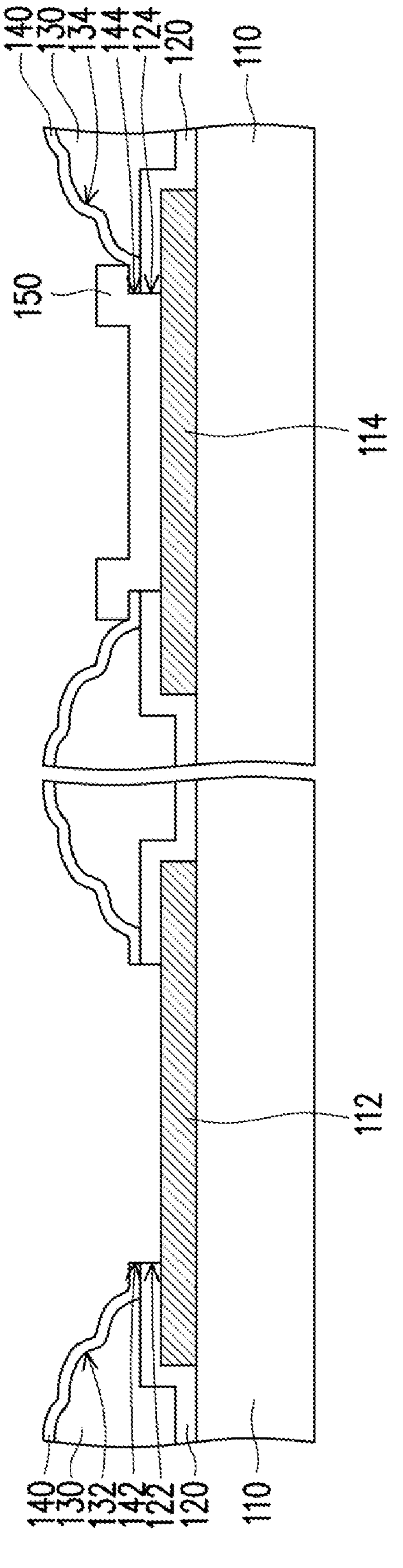
FIG. 2A to FIG. 2E are sectional schematic views of a manufacturing process of a display panel according to a second embodiment of the present disclosure.
Figure 2B:
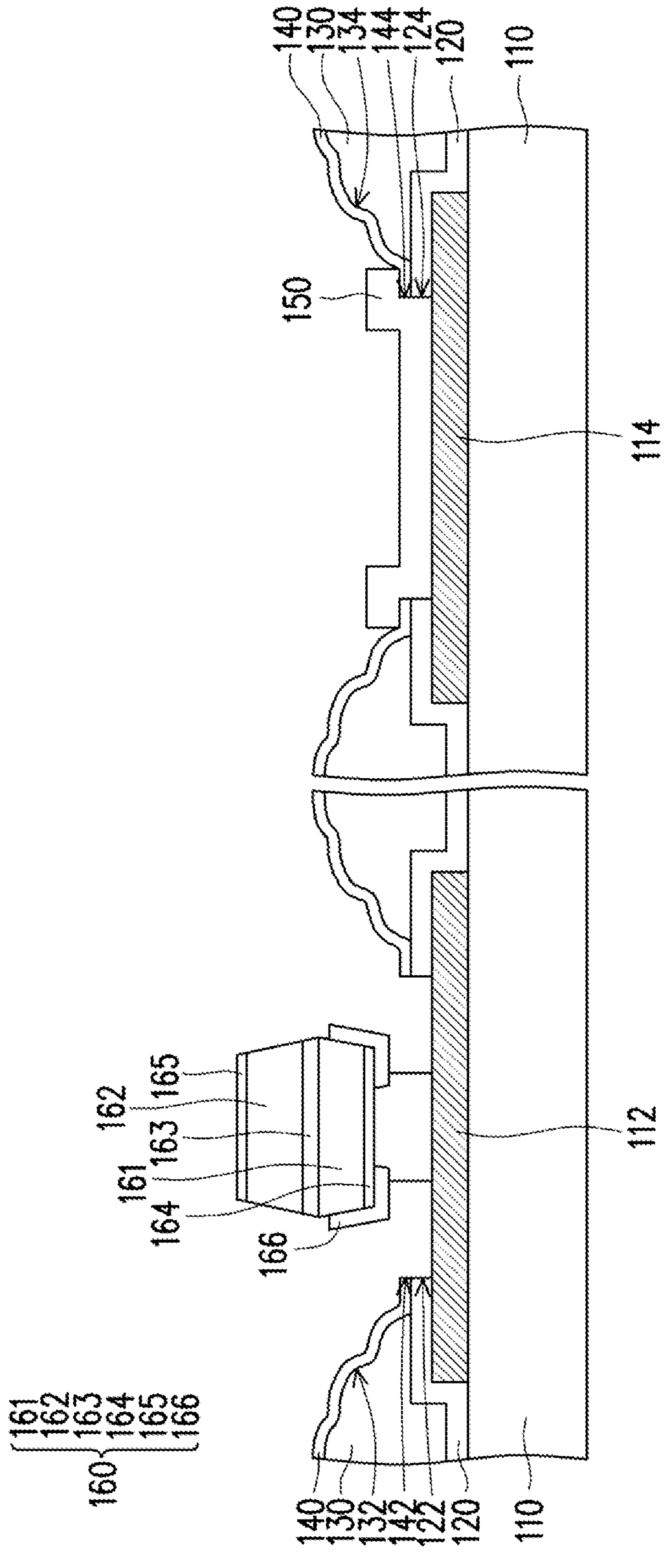
Figure 2C:
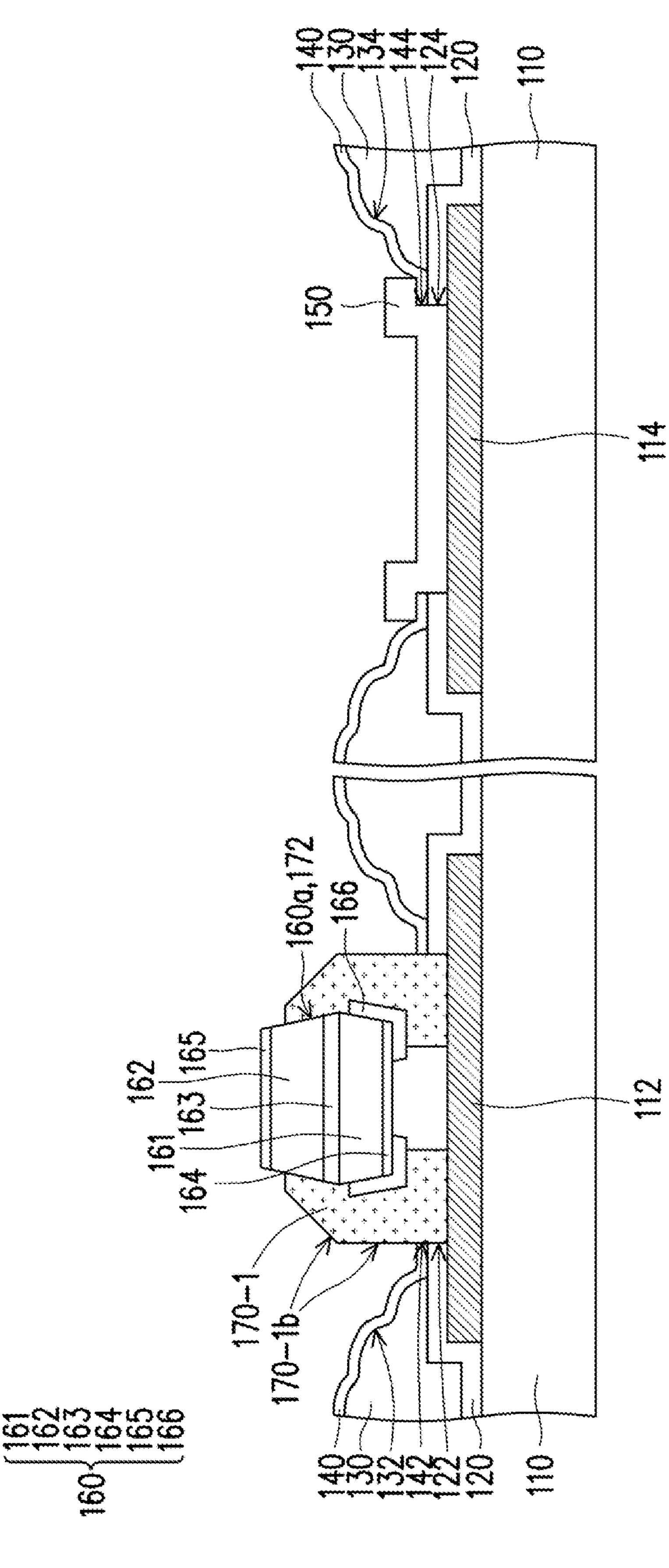
Figure 2D:
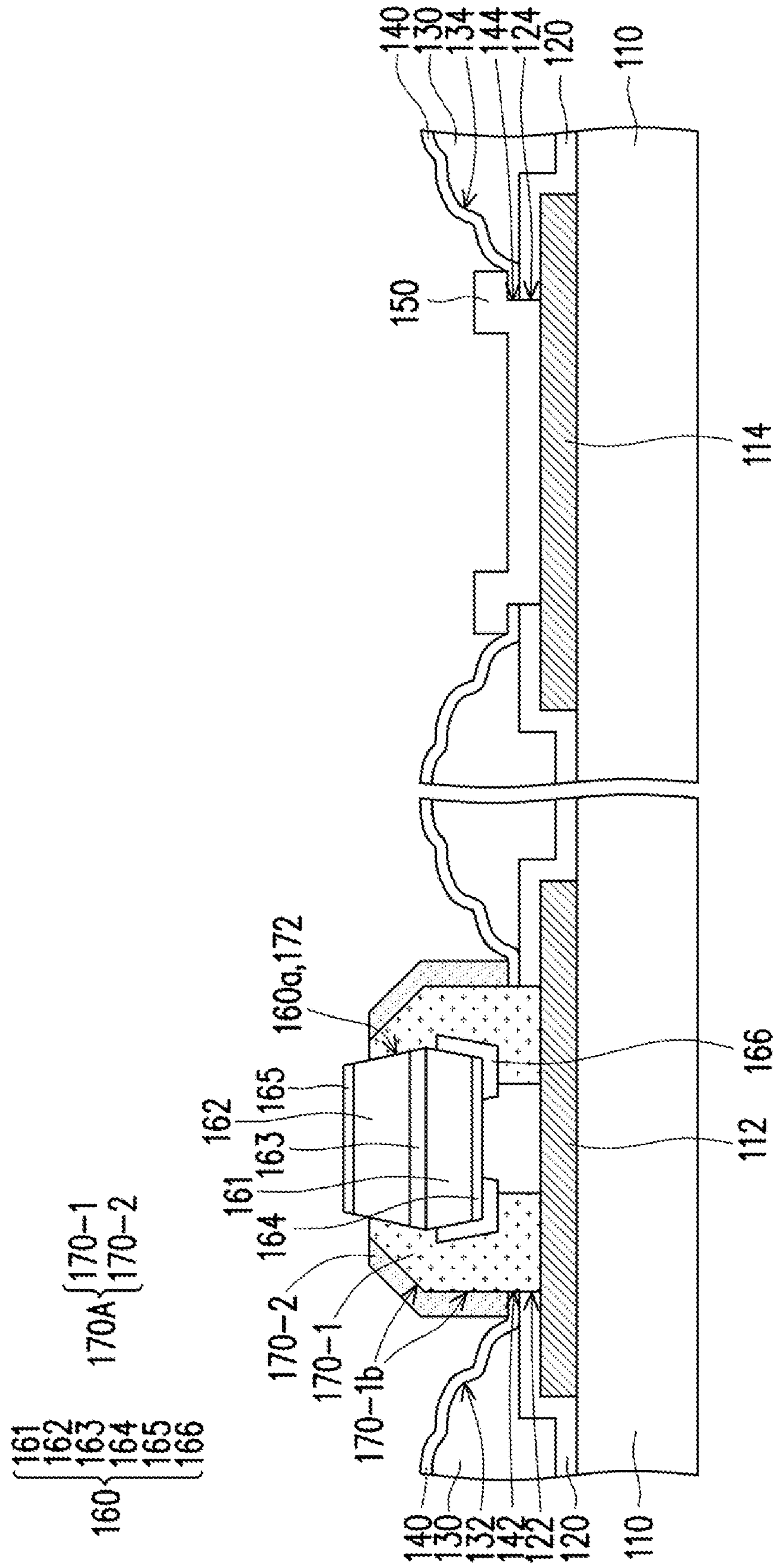

Referring to FIG. 2C and FIG. 2D, in the present embodiment, a main portion 170-1 is formed on the first pad 112 and the peripheral surface 160*a* of the light emitting component 160. The main portion 170-1 has a peripheral surface 170-1*b* located around the light emitting component 160. Subsequently, an auxiliary portion 170-2 is formed at least on the peripheral surface 170-1*b* of the main portion 170-1. Referring to FIG. 2D, in the present embodiment, the reflective structure 170A includes the main portion 170-1 and the auxiliary portion 170-2. The main portion 170-1 is disposed on the peripheral surface 160*a* of the light emitting component 160, and the auxiliary portion 170-2 is disposed at least on the peripheral surface 170-1*b* of the main portion 170-1.

Figure 2E:
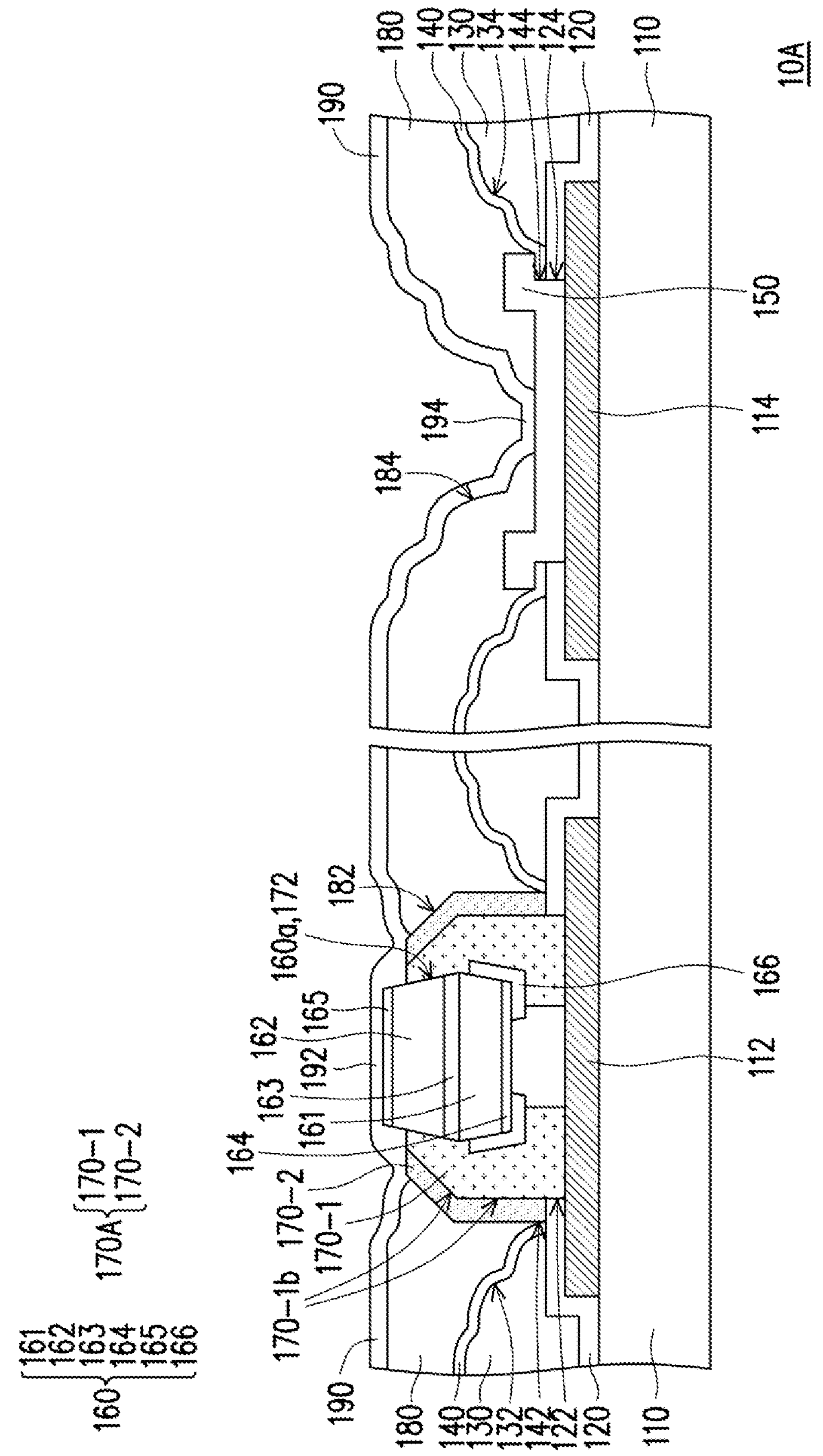

Referring to FIG. 2E, if the light beam (not illustrated) transmitted toward the peripheral surface 160*a* of the light emitting component 160 passes through the main portion 170-1 of the reflective structure 170A without being reflected, the auxiliary portion 170-2 may reflect the light beam passing through the main portion 170-1, thereby guiding the light beam toward the side where the second electrode 165 is located. Thus, the brightness of the display panel 10A may be further enhanced.

The material of the main portion 170-1 of the reflective structure 170A is different from the material of the auxiliary portion 170-2. For example, in one embodiment, the material of the main portion 170-1 may be a white organic material, and the material of the auxiliary portion 170-2 may be a black organic material, but the present disclosure is not limited thereto. In one embodiment, the optical density (OD) of the auxiliary portion 170-2 may be greater than or equal to 1. Preferably, the OD of the auxiliary portion 170-2 may be greater than or equal to 2, but the present disclosure is not limited thereto.

Figure 3:
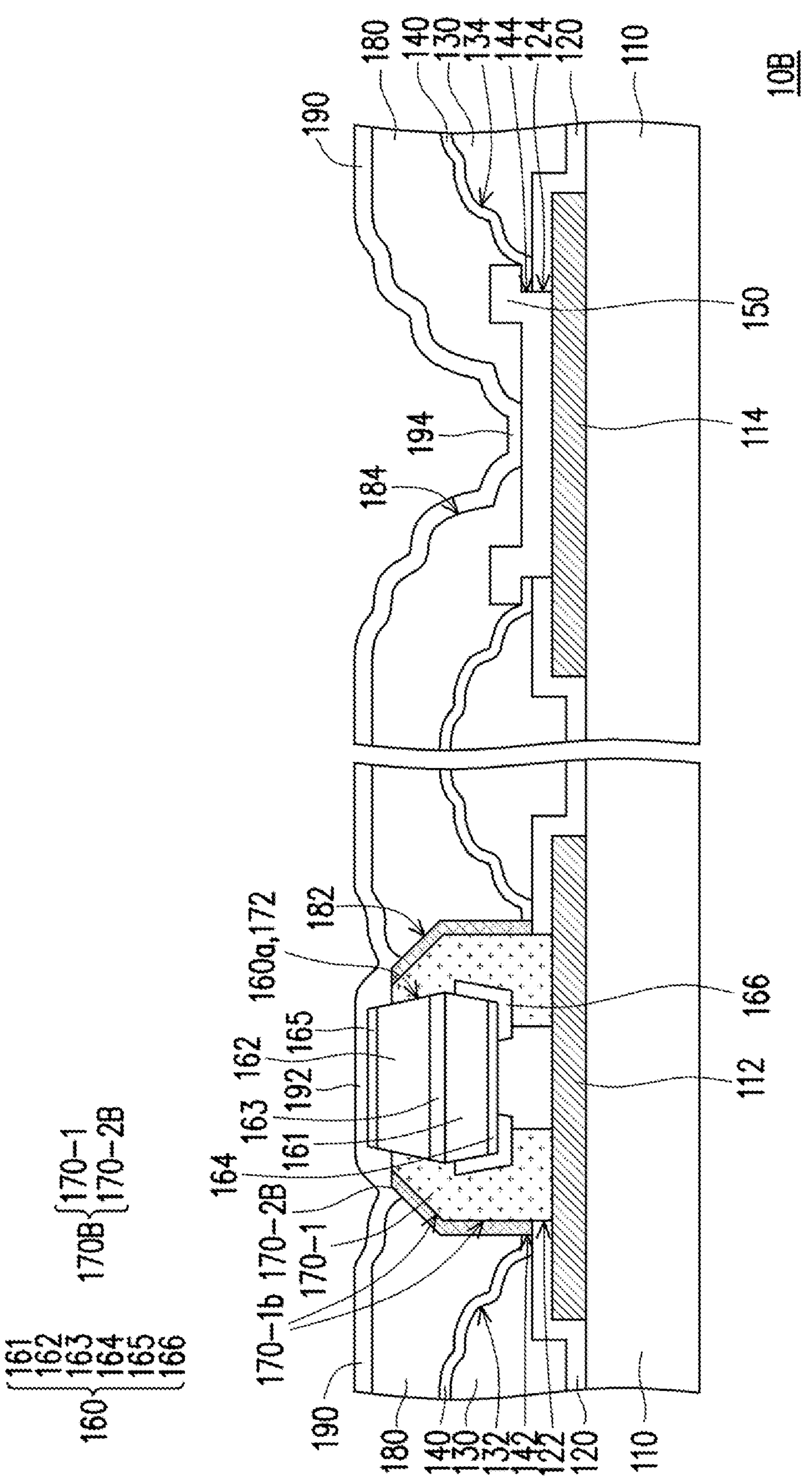
FIG. 3 is a sectional schematic view of a display panel according to a third embodiment of the present disclosure.

FIG. 3 is a sectional schematic view of a display panel according to a third embodiment of the present disclosure. The display panel 10B and the manufacturing process thereof in the third embodiment are similar to the display panel 10A and the manufacturing process thereof in the second embodiment, and the difference between the two exists in that the reflective structure 170B in the third embodiment is different from the reflective structure 170A in the second embodiment. Specifically, the material of the auxiliary portion 170-2B of the reflective structure 170B in the third embodiment is different from the material of the auxiliary portion 170-2 of the reflective structure 170A in the second embodiment. In the third embodiment, the material of the auxiliary portion 170-2B of the reflective structure 170B may be metal.

FIG. 4A to FIG. 4D are sectional schematic views of a manufacturing process of a display panel according to a fourth embodiment of the present disclosure. The display panel 10C and the manufacturing process thereof in the fourth embodiment are similar to the display panel 10 and the manufacturing process thereof in the first embodiment, and the difference between the two exists in that the reflective structure 170C in the fourth embodiment is different from the reflective structure 170 in the first embodiment. In addition, in the fourth embodiment, the reflective structure 170C may replace the flat layer 180 in the first embodiment, and the display panel 10C in the fourth embodiment may omit the flat layer 180 of the display panel 10 in the first embodiment.

Figure 4A:
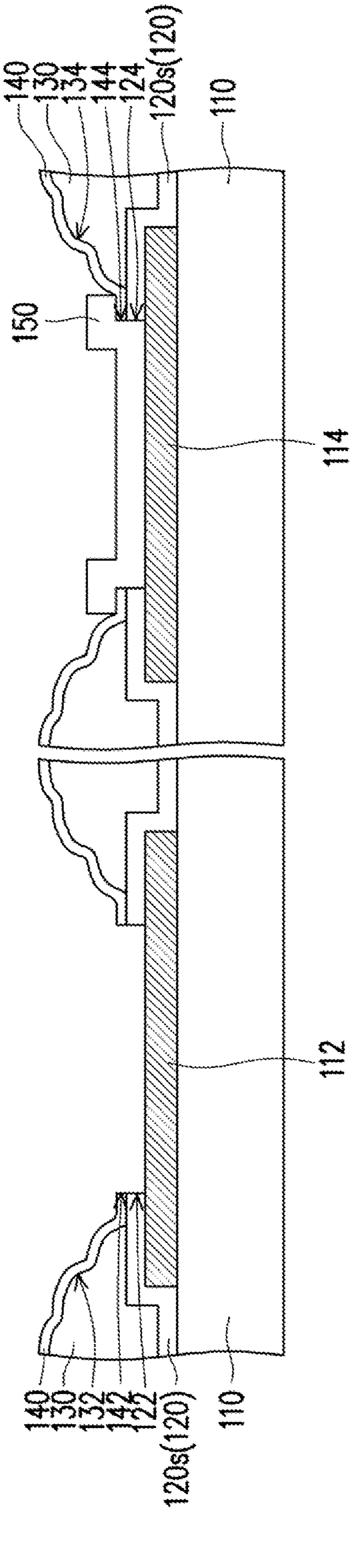
FIG. 4A to FIG. 4D are sectional schematic views of a manufacturing process of a display panel according to a fourth embodiment of the present disclosure.
Figure 4B:
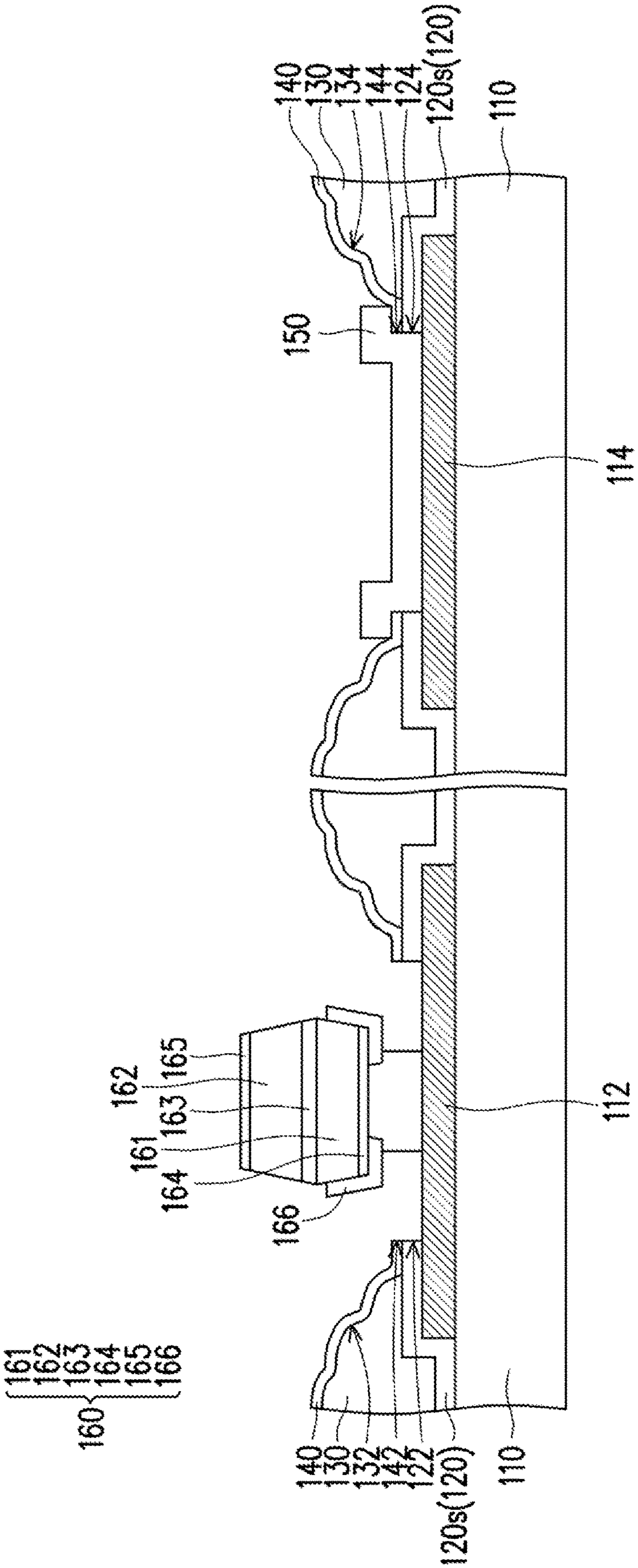
Figure 4C:
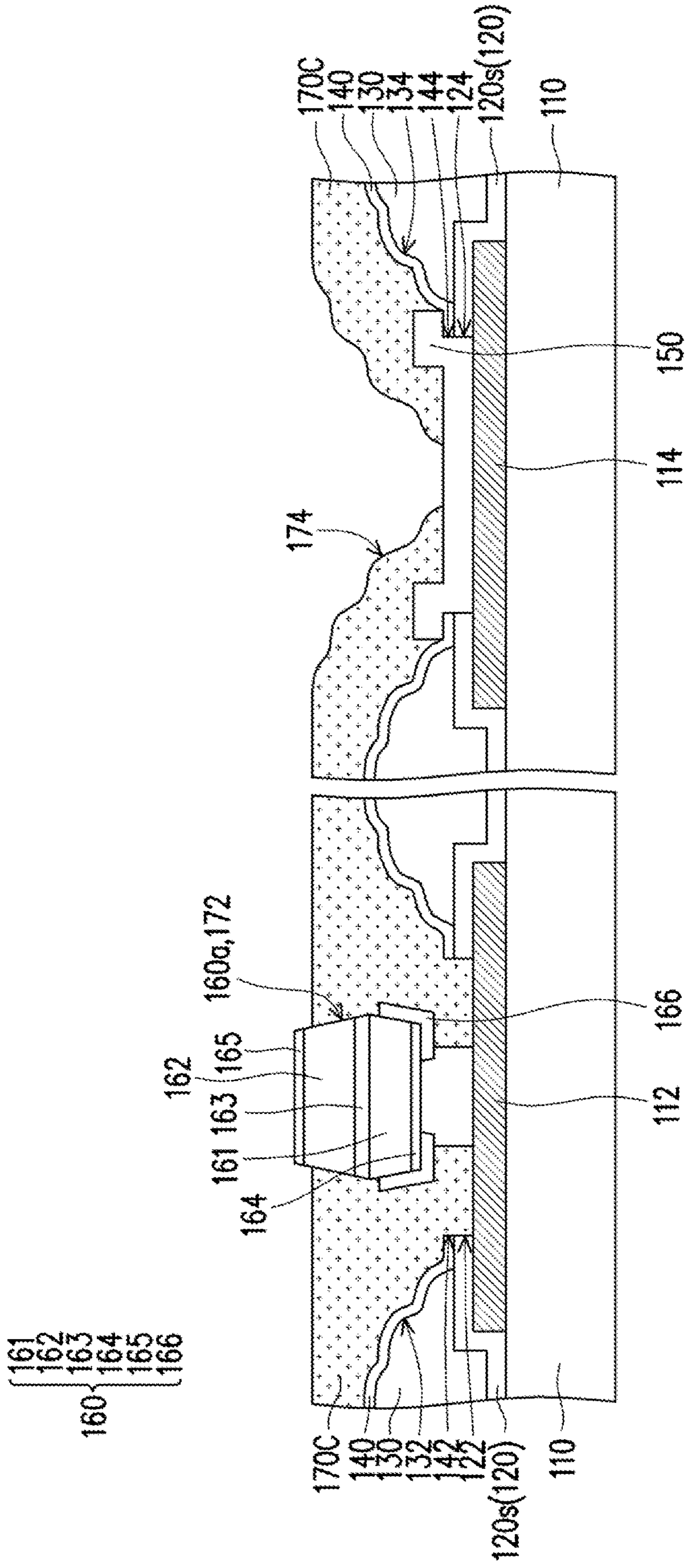
Figure 4D:
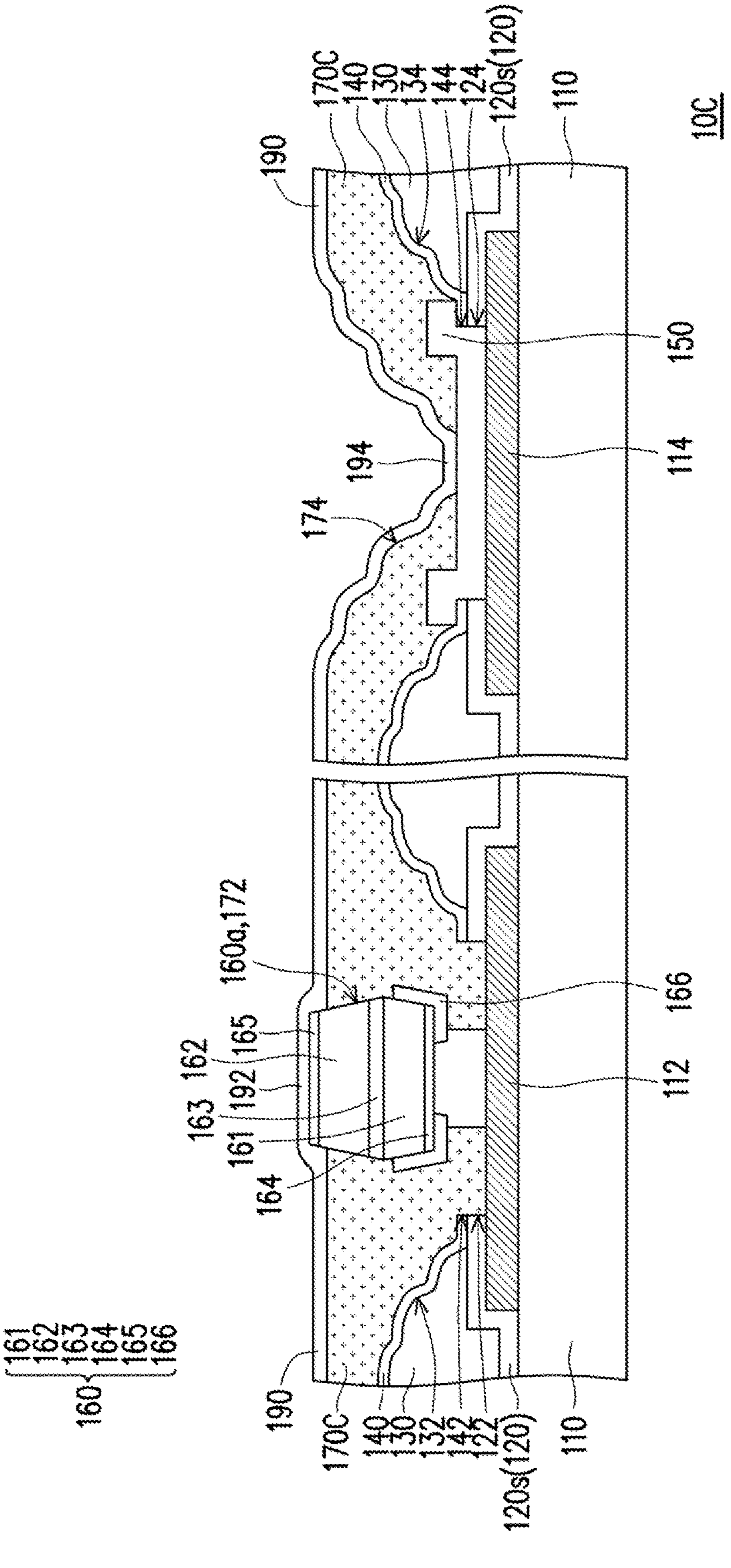
Figure 5A:
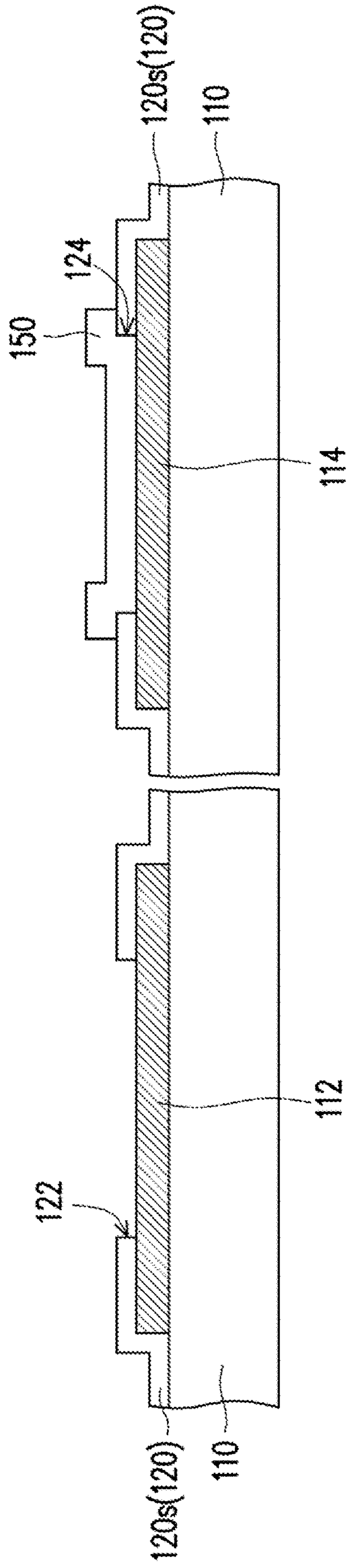
FIG. 5A to FIG. 5D are sectional schematic views of a manufacturing process of a display panel according to a fifth embodiment of the present disclosure.
Figure 5B:
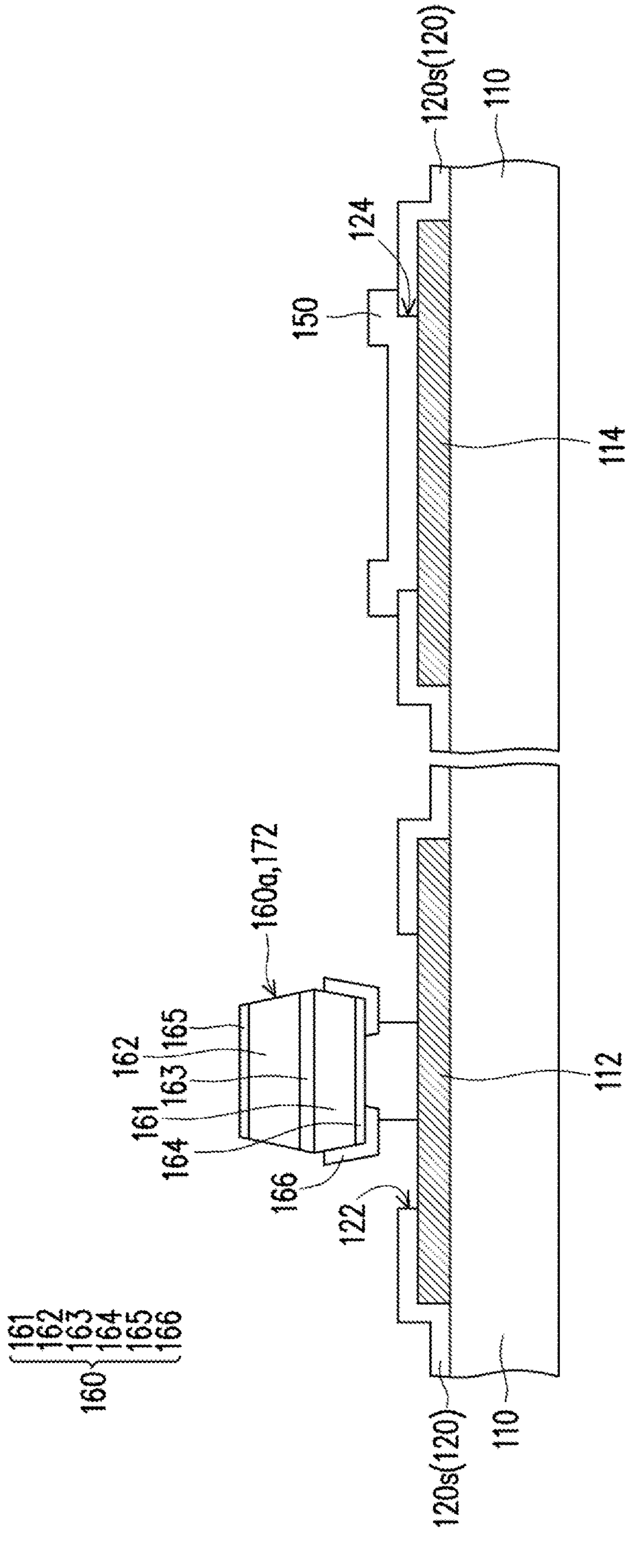
Figure 5C:
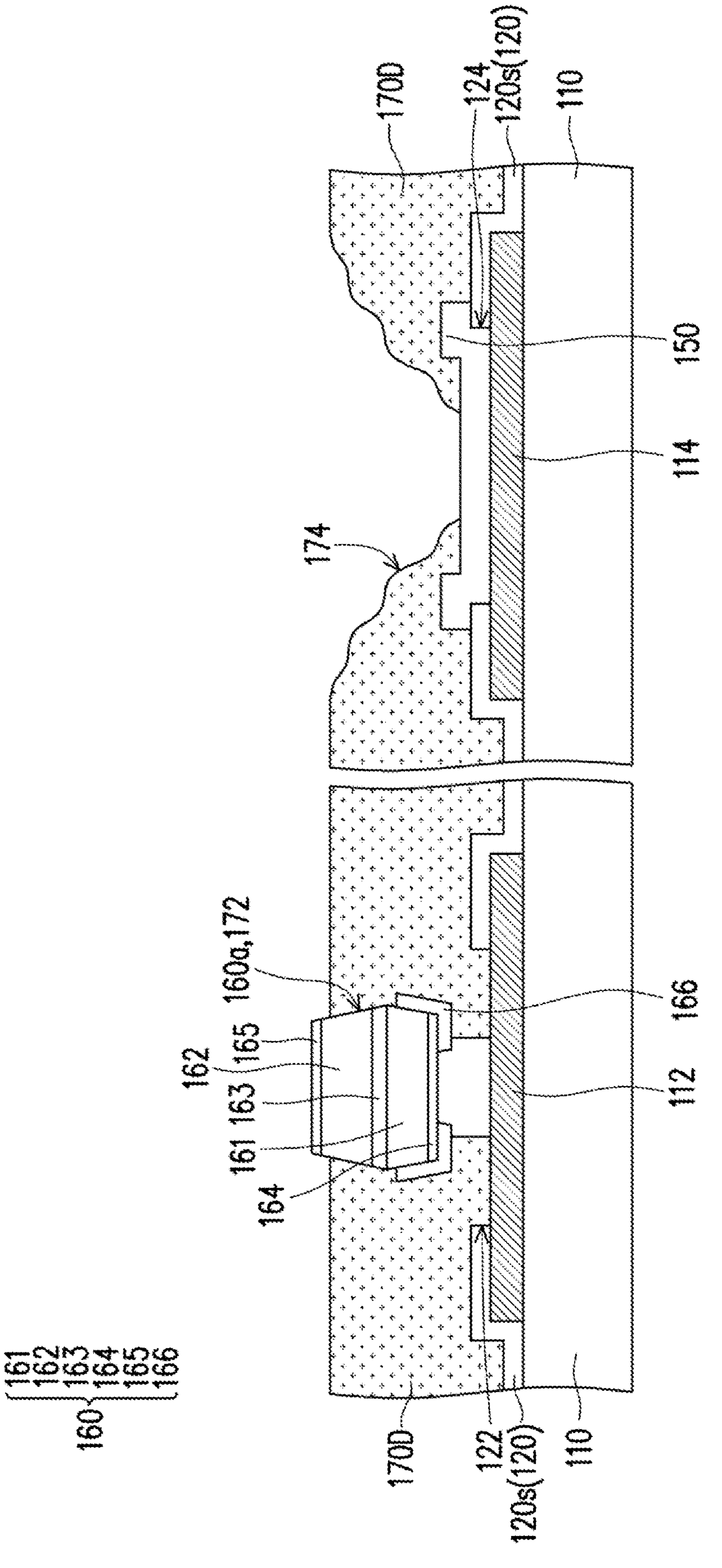
Figure 5D:
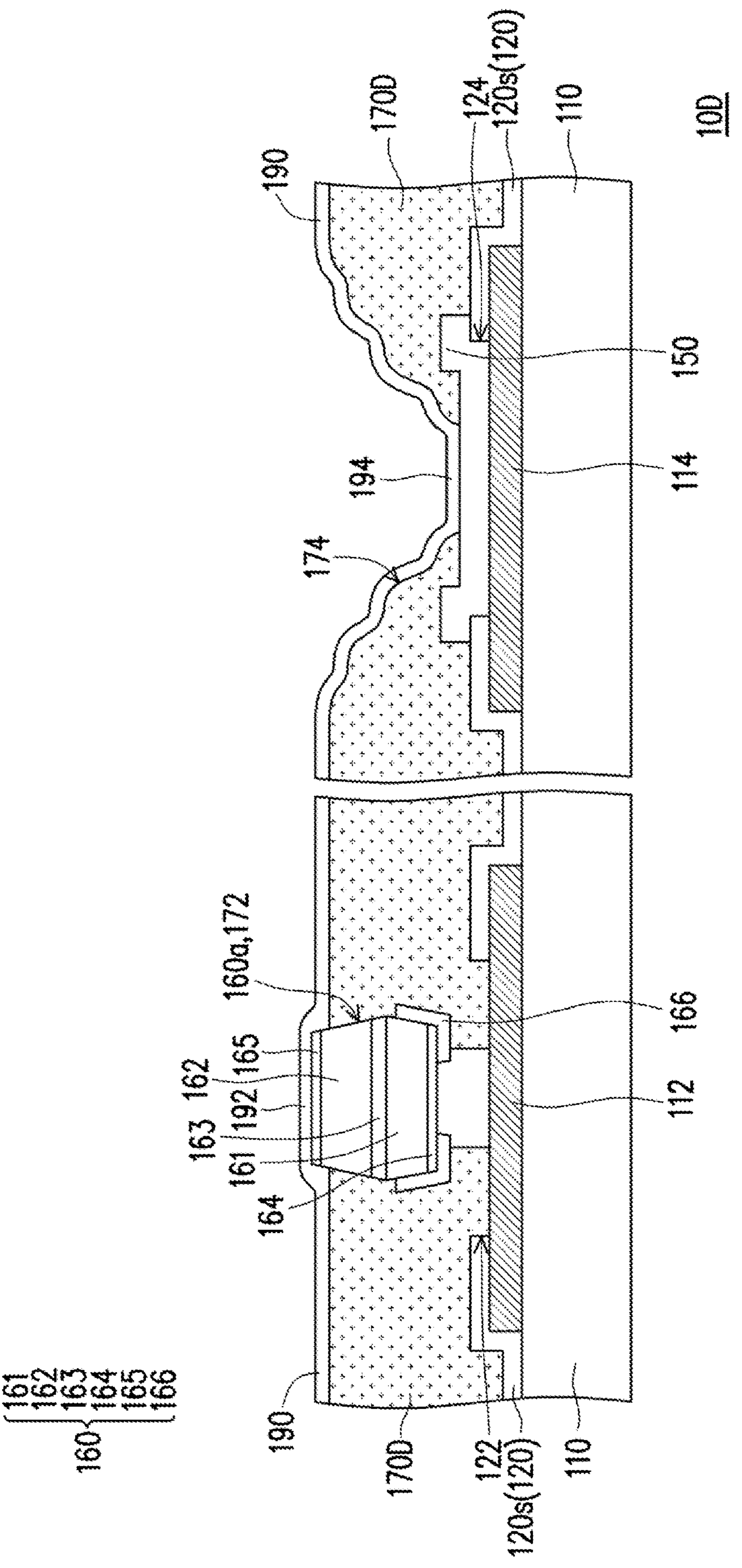

Referring to FIG. 4D, in the present embodiment, the insulating layer 120 is disposed on the driving backplane 110 and has a first opening 122 overlapping with the first pad 112 and a body 120*s* defining the first opening 122. The reflective structure 170C is disposed in the first opening 122 of the insulating layer 120 and on the body 120*s* of the insulating layer 120, and the bridging component 190 may be directly disposed on the reflective structure 170C. In the present embodiment, the reflective structure 170C may have a second opening 174 overlapping with the second pad 114, and the other end 194 of the bridging component 190 is filled in the second opening 174 of the reflective structure 170C to be electrically connected to the second pad 114.

FIG. 5A to FIG. 5D are sectional schematic views of a manufacturing process of a display panel according to a fifth embodiment of the present disclosure. The display panel 10D and the manufacturing process thereof in the fifth embodiment are similar to the display panel 10C and the manufacturing process thereof in the fourth embodiment, and the difference between the two exists in that the reflective structure 170D in the fifth embodiment is different from the reflective structure 170C in the fourth embodiment. In the fifth embodiment, the reflective structure 170D may replace the flat layer 130 and the shielding protective layer 140 of the display panel 10C in the fourth embodiment. The display panel 10D in the fifth embodiment may omit the flat layer 130 and the shielding protective layer 140 of the display panel 10C in the fourth embodiment.

Figure 6A:
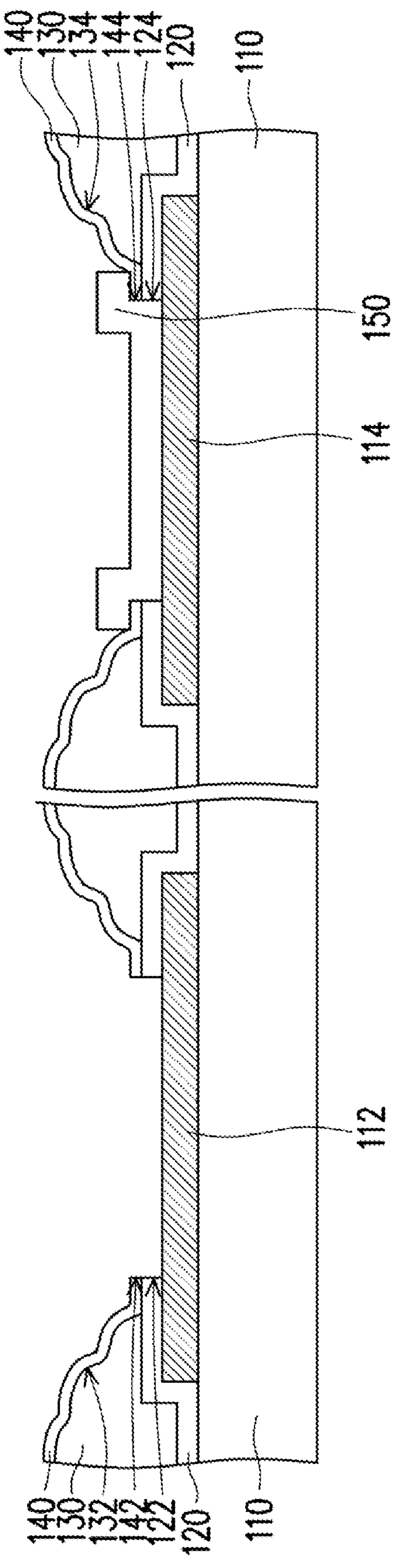
FIG. 6A to FIG. 6D are sectional schematic views of a manufacturing process of a display panel according to a sixth embodiment of the present disclosure.
Figure 6B:
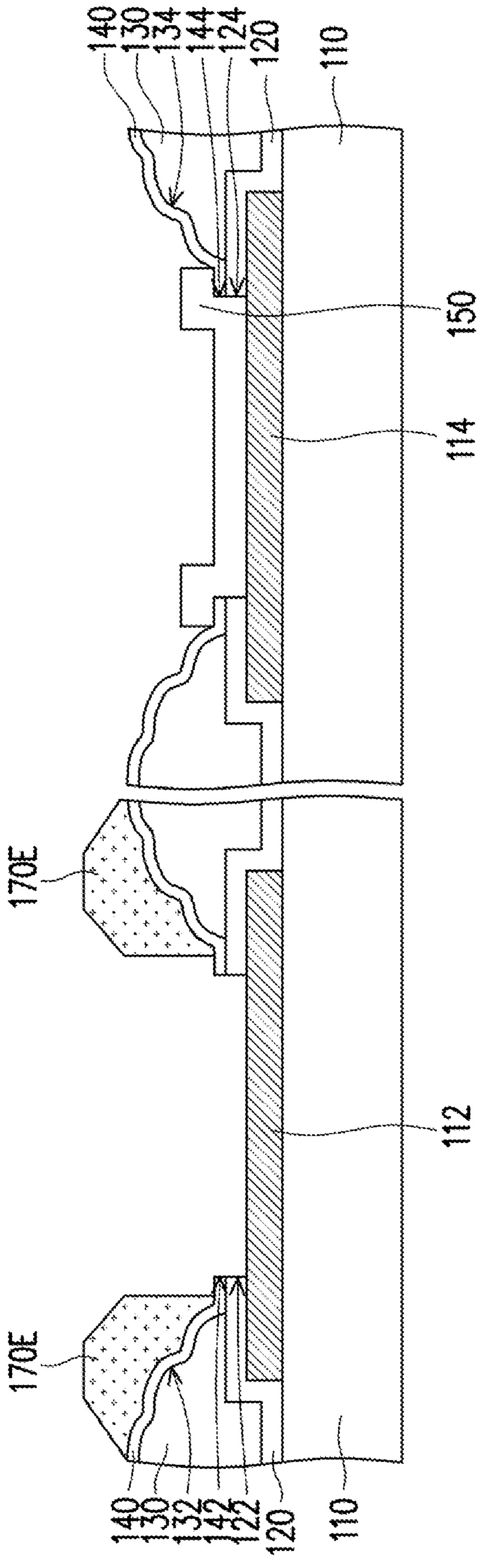
Figure 6C:
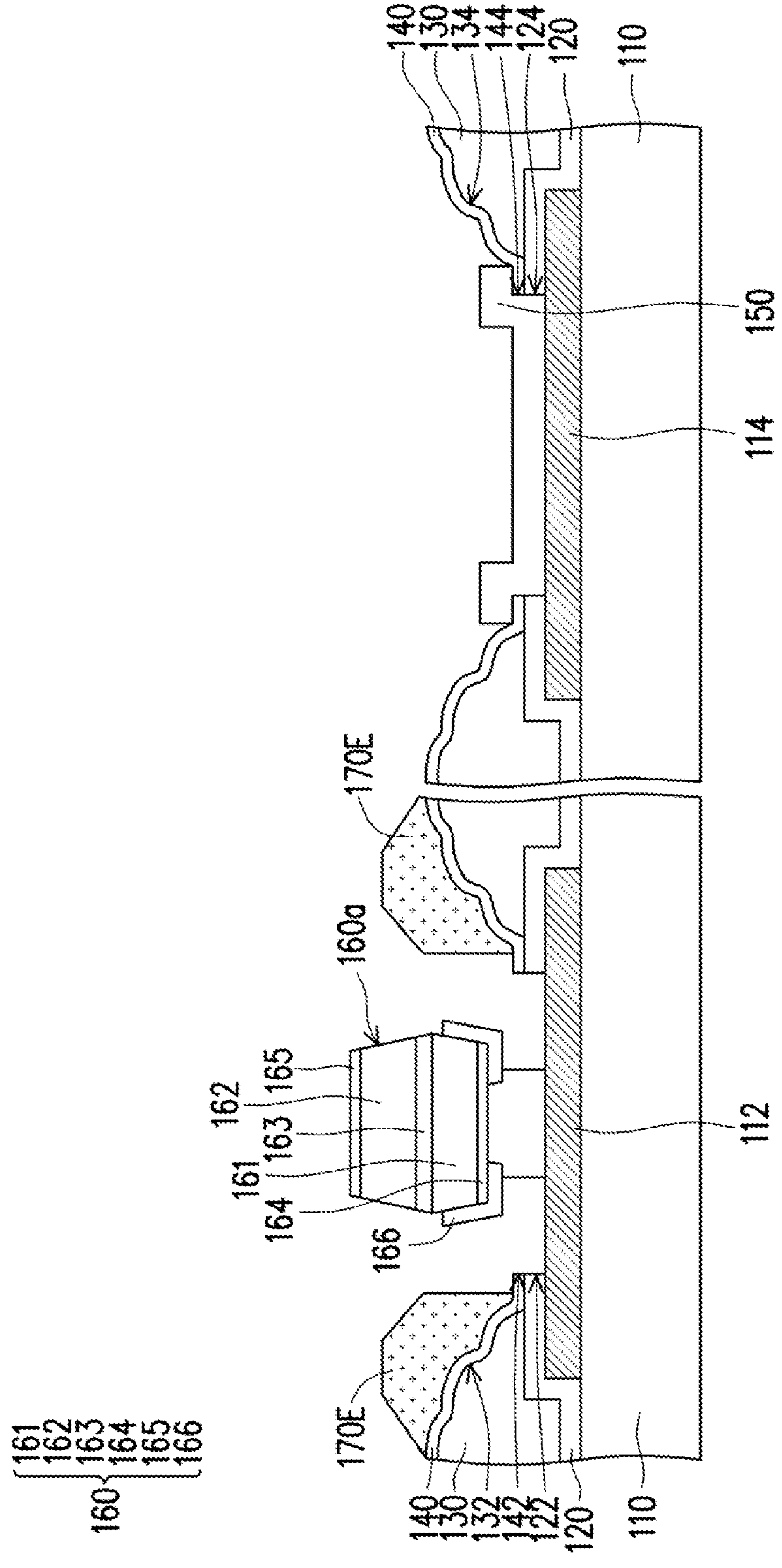

FIG. 6A to FIG. 6D are sectional schematic views of a manufacturing process of a display panel according to a sixth embodiment of the present disclosure. The display panel 10E and the manufacturing process thereof in the sixth embodiment are similar to the display panel 10 and the manufacturing process thereof in the first embodiment, and the difference between the two exists in that the reflective structure 170E in the sixth embodiment is different from the reflective structure 170 in the first embodiment. In addition, as shown in FIG. 6A to FIG. 6C, in the present embodiment, the reflective structure 170E has been formed on the insulating layer 120 prior to the light emitting component 160 being transferred to the driving backplane 110.

Figure 6D:
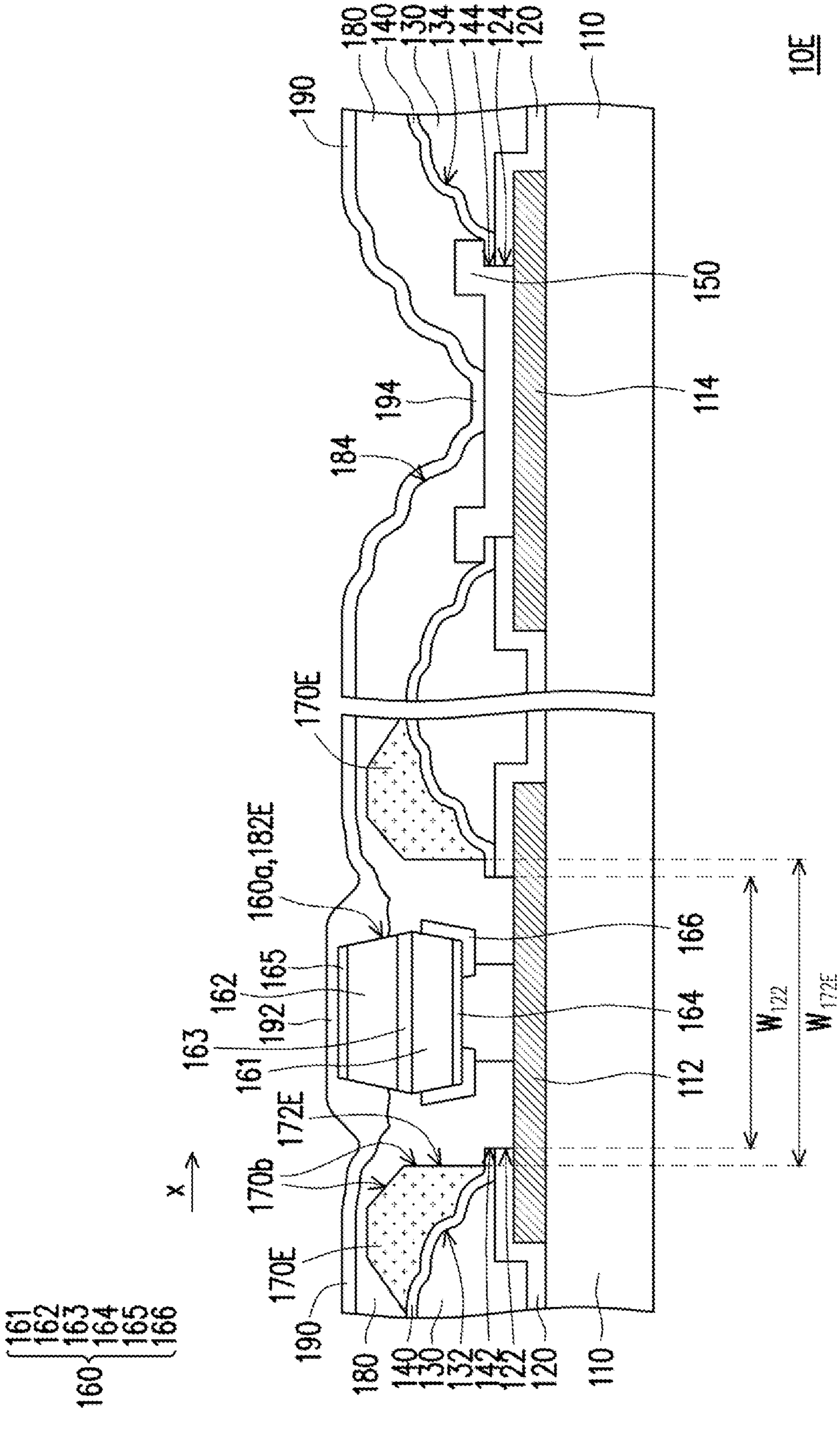

Referring to FIG. 6D, in the present embodiment, the reflective structure 170E may be a stopping wall structure. In detail, the reflective structure 170E has a first opening 172E overlapping with the first pad 112 and the light emitting component 160. The flat layer 180 is disposed on the reflective structure 170E and filled in the first opening 172E of the reflective structure 170E. The flat layer 180 may directly contact the peripheral surface 160*a* of the light emitting component 160. The flat layer 180 may directly contact the first pad 112. The flat layer 180 may have the first opening 182E overlapping with the light emitting component 160. The reflective structure 170E is disposed between the flat layer 180 and the insulating layer 120. A width $W_{172E}$ of the first opening 172E of the reflective structure 170E in the second direction x is greater than a width $W_{122}$ of the first opening 122 of the insulating layer 120 in the second direction x. In the present embodiment, the flat layer 180 has a high transmittance. For example, the transmittance of the flat layer 180 is preferably greater than or equal to 90%.

FIG. 7A to FIG. 7E are sectional schematic views of a manufacturing process of a display panel according to a seventh embodiment of the present disclosure. The display panel 10F and the manufacturing process thereof in the seventh embodiment are similar to the display panel 10E and the manufacturing process thereof in the sixth embodiment, and the difference between the two exists in that the reflective structure 170F in the seventh embodiment is different from the reflective structure 170E in the sixth embodiment.

Figure 7A:
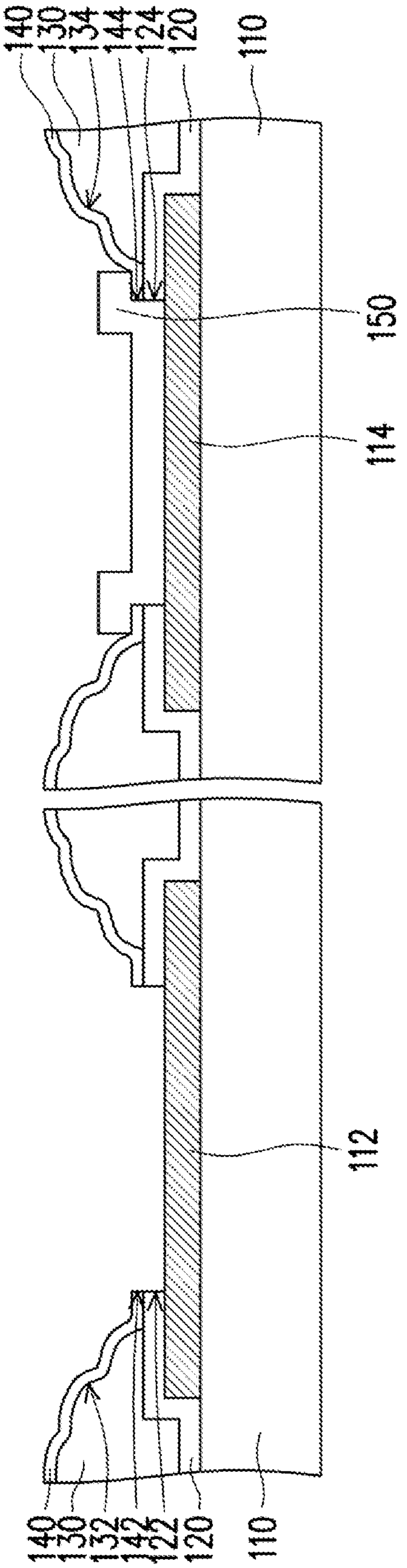
FIG. 7A to FIG. 7E are sectional schematic views of a manufacturing process of a display panel according to a seventh embodiment of the present disclosure.
Figure 7B:
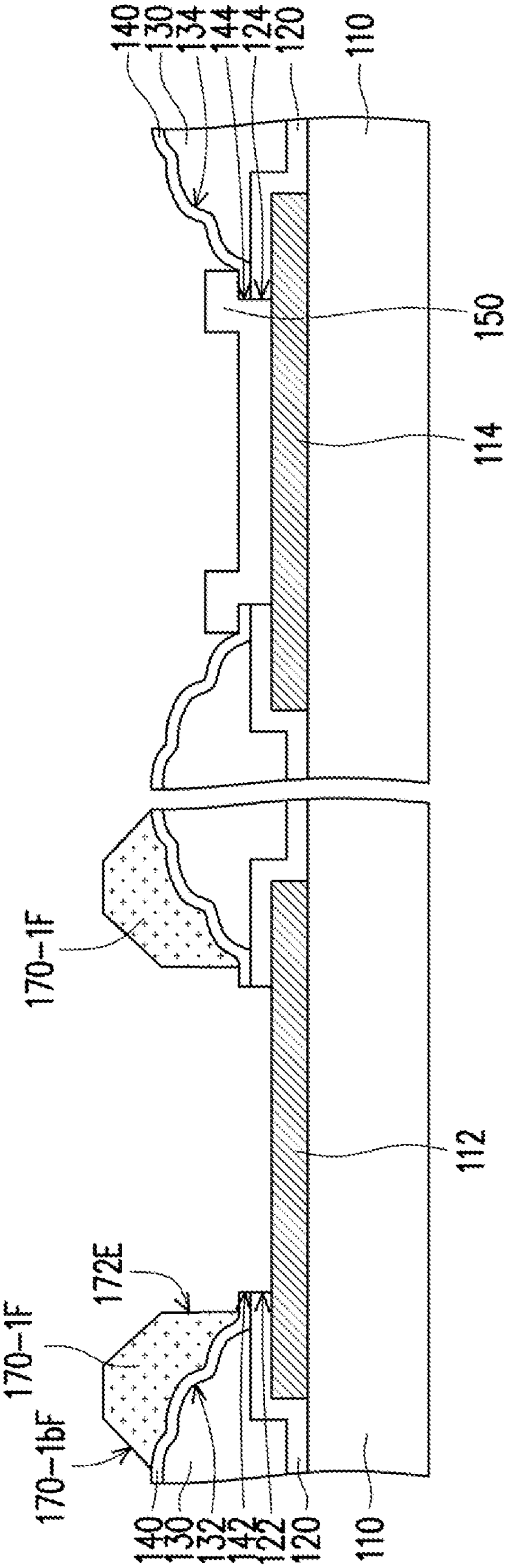
Figure 7C:
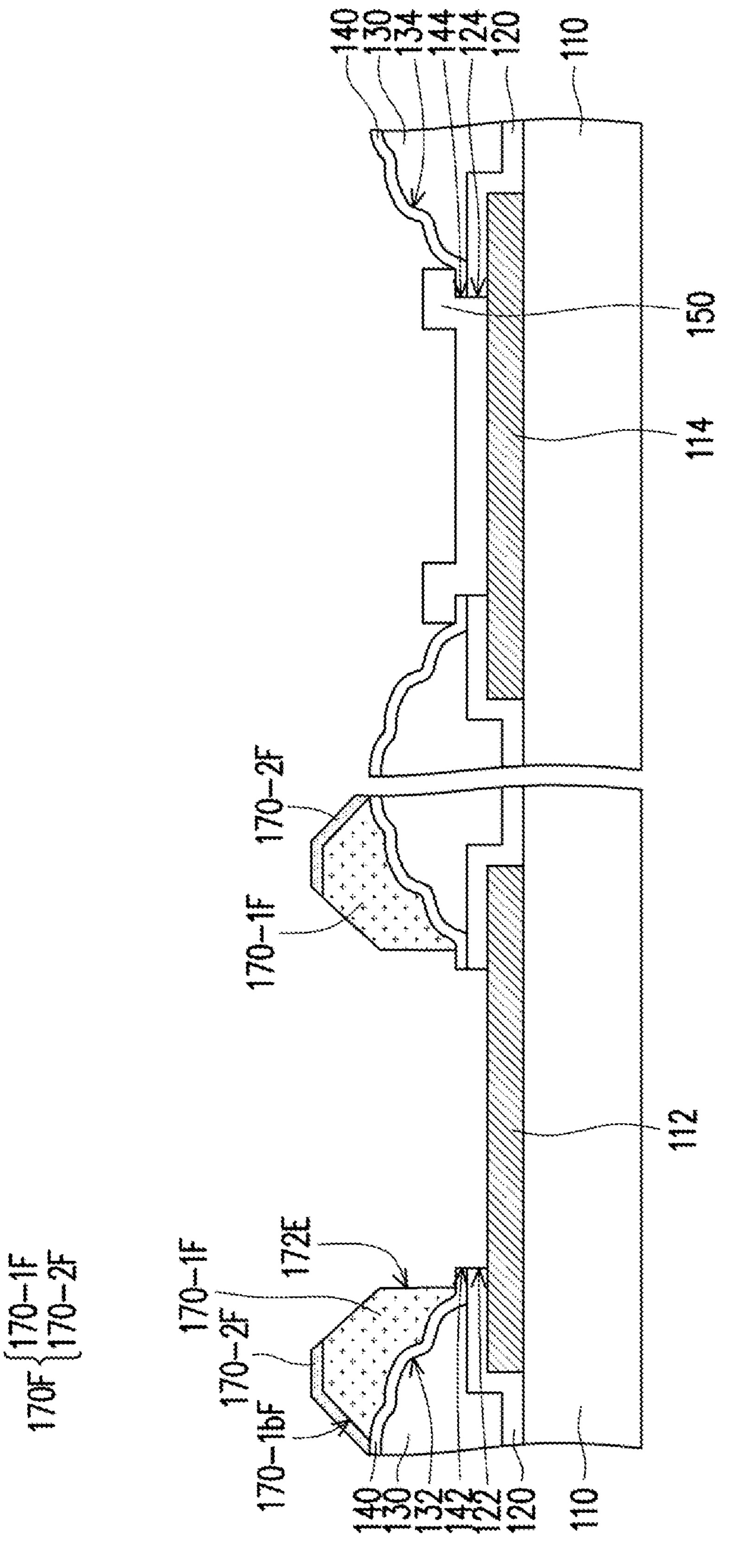
Figure 7D:
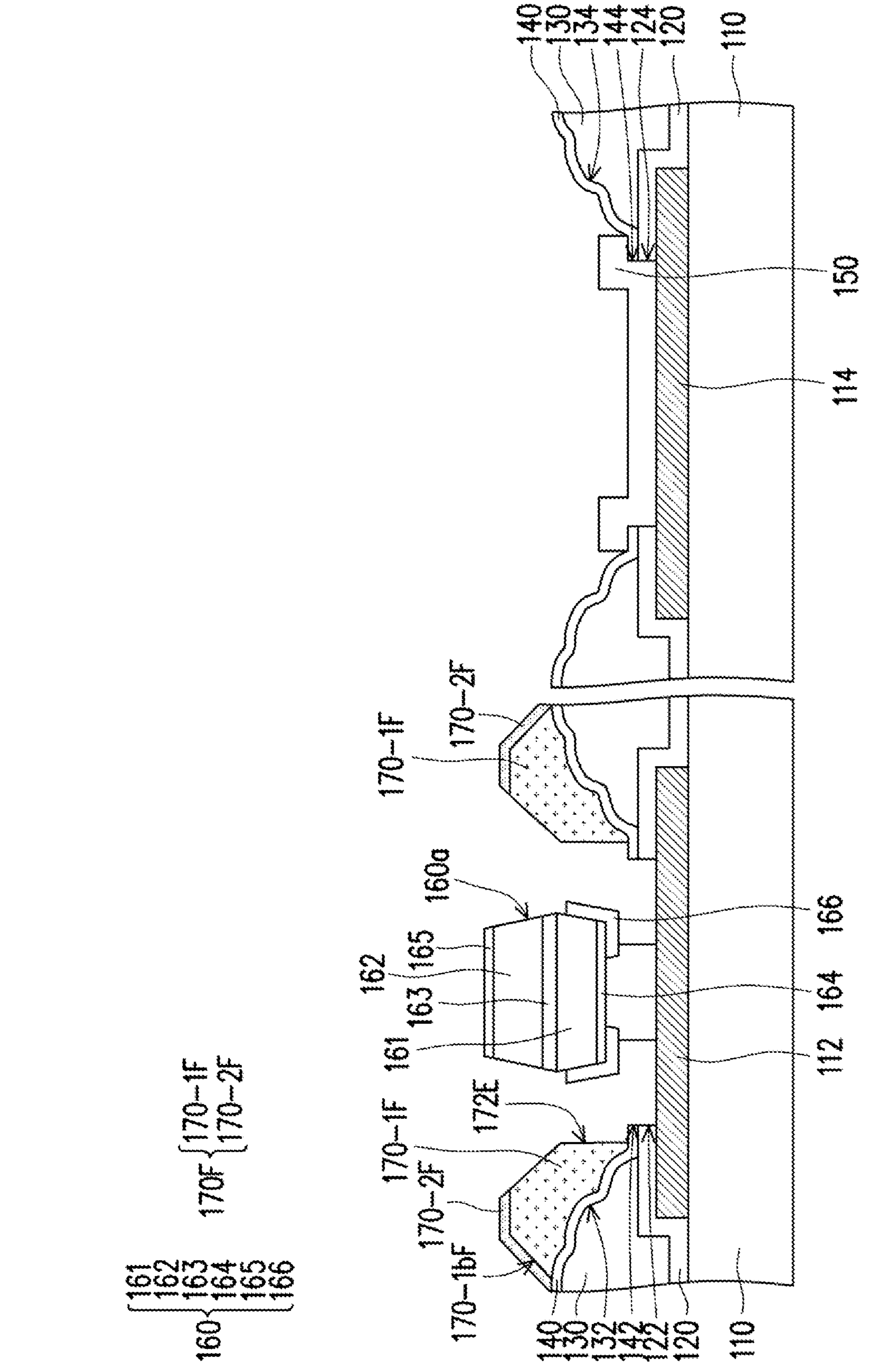
Figure 7E:
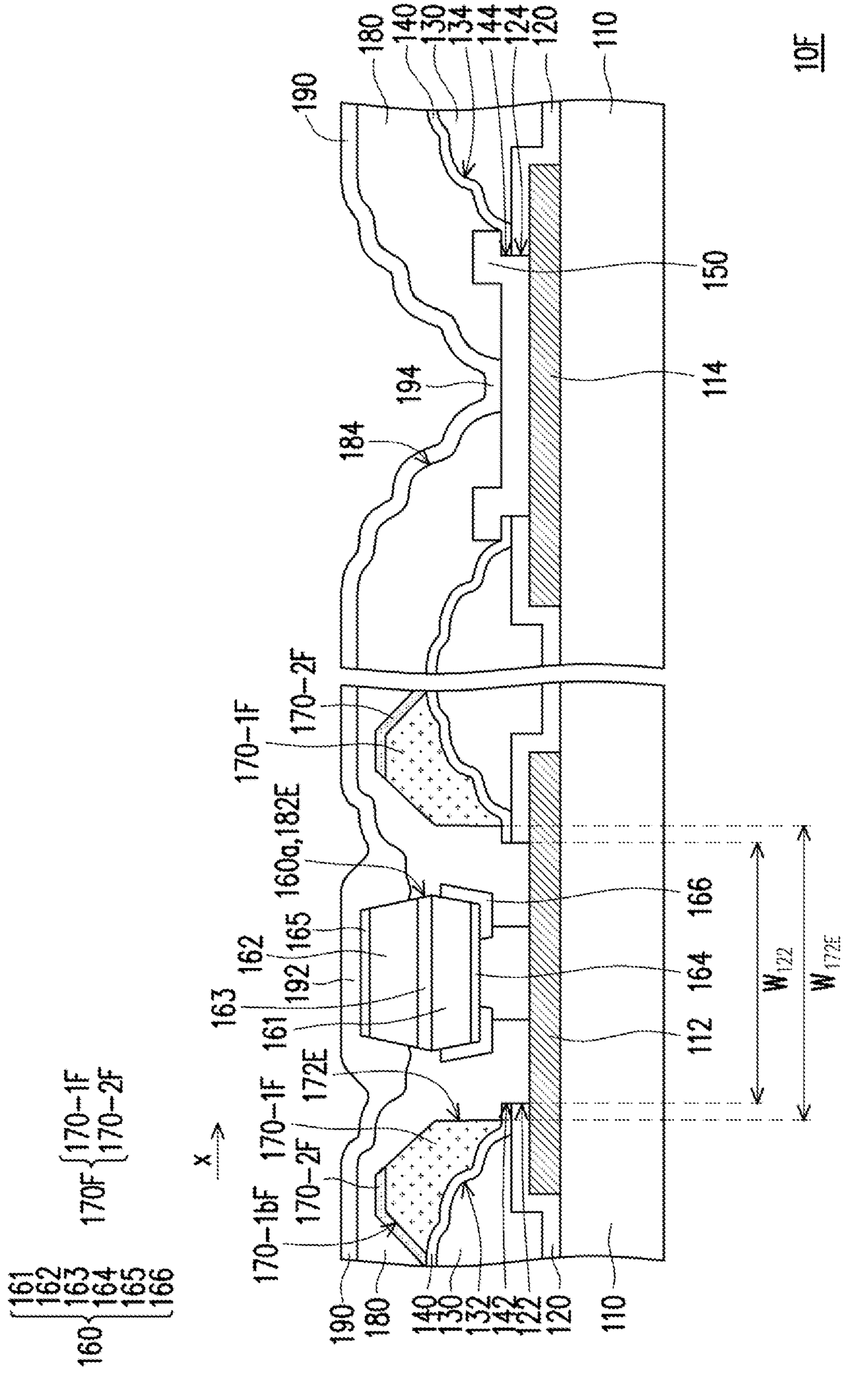

Referring to FIG. 7B, in the present embodiment, a main portion 170-1F is formed on the insulating layer 120. The main portion 170-1F may have a peripheral surface 170-1*b*F located outside the first opening 172E and around the first opening 172E. Referring to FIG. 7C, subsequently, an auxiliary portion 170-2F is formed at least on the peripheral surface 170-1*b*F of the main portion 170-1F. The reflective structure 170F includes the main portion 170-1F and the auxiliary portion 170-2F. The main portion 170-1F is disposed on the insulating layer 120, and the auxiliary portion 170-2F is disposed at least on the peripheral surface 170-1*b*F of the main portion 170-1F. The material of the main portion 170-1F of the reflective structure 170F is different from the material of the auxiliary portion 170-2F. For example, in one embodiment, the material of the main portion 170-1F may be a white organic material, and the material of the auxiliary portion 170-2F may be a black organic material, but the present disclosure is not limited thereto.

Figure 8:
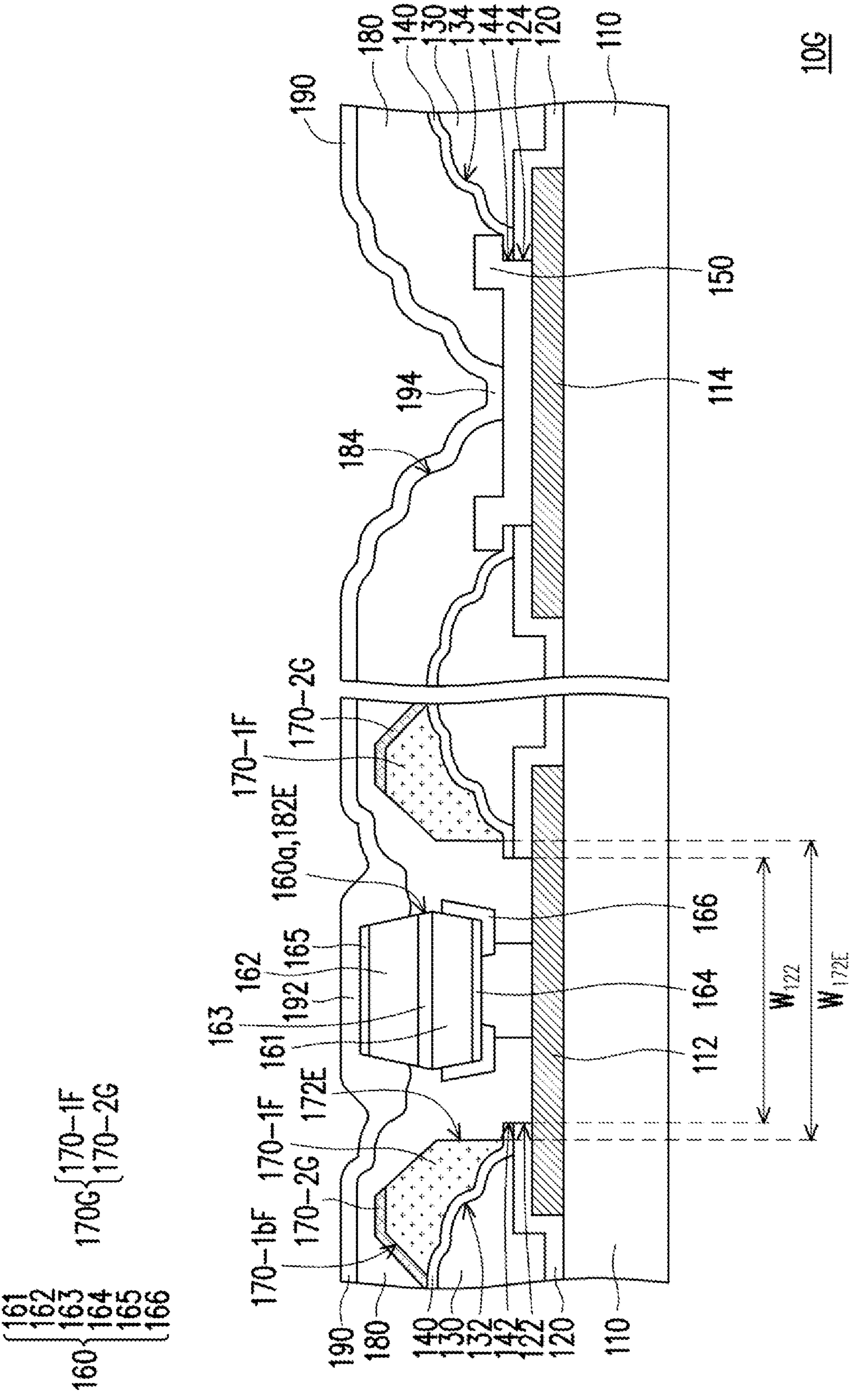
FIG. 8 is a sectional schematic view of a display panel according to an eighth embodiment of the present disclosure.

FIG. 8 is a sectional schematic view of a display panel according to an eighth embodiment of the present disclosure. The display panel 10G and the manufacturing process thereof in the eighth embodiment are similar to the display panel 10F and the manufacturing process thereof in the seventh embodiment, and the difference between the two exists in that the reflective structure 170G in the eighth embodiment is different from the reflective structure 170F in the seventh embodiment. Specifically, the material of the auxiliary portion 170-2G of the reflective structure 170G in the eighth embodiment is different from the material of the auxiliary portion 170-2F of the reflective structure 170F in the seventh embodiment. In the eighth embodiment, the material of the auxiliary portion 170-2G of the reflective structure 170G may be metal.

FIG. 9A to FIG. 9D are sectional schematic views of a manufacturing process of a display panel according to a ninth embodiment of the present disclosure. The display panel 10H and the manufacturing process thereof in the ninth embodiment are similar to the display panel 10E and the manufacturing process thereof in the sixth embodiment, and the difference between the two exists in that the reflective structure 170H in the ninth embodiment is different from the reflective structure 170E in the sixth embodiment. In the ninth embodiment, the reflective structure 170H may replace the flat layer 130 and the shielding protective layer 140 of the display panel 10E in the sixth embodiment. The display panel 10H in the ninth embodiment may omit the flat layer 130 and the shielding protective layer 140 of the display panel 10E in the sixth embodiment.

Figure 9A:
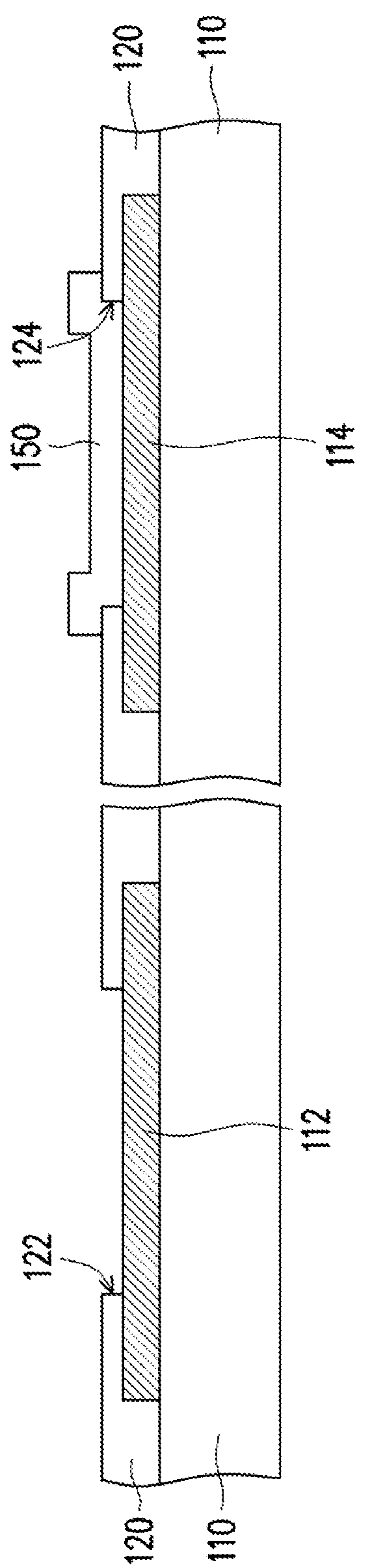
FIG. 9A to FIG. 9D are sectional schematic views of a manufacturing process of a display panel according to a ninth embodiment of the present disclosure.
Figure 9B:
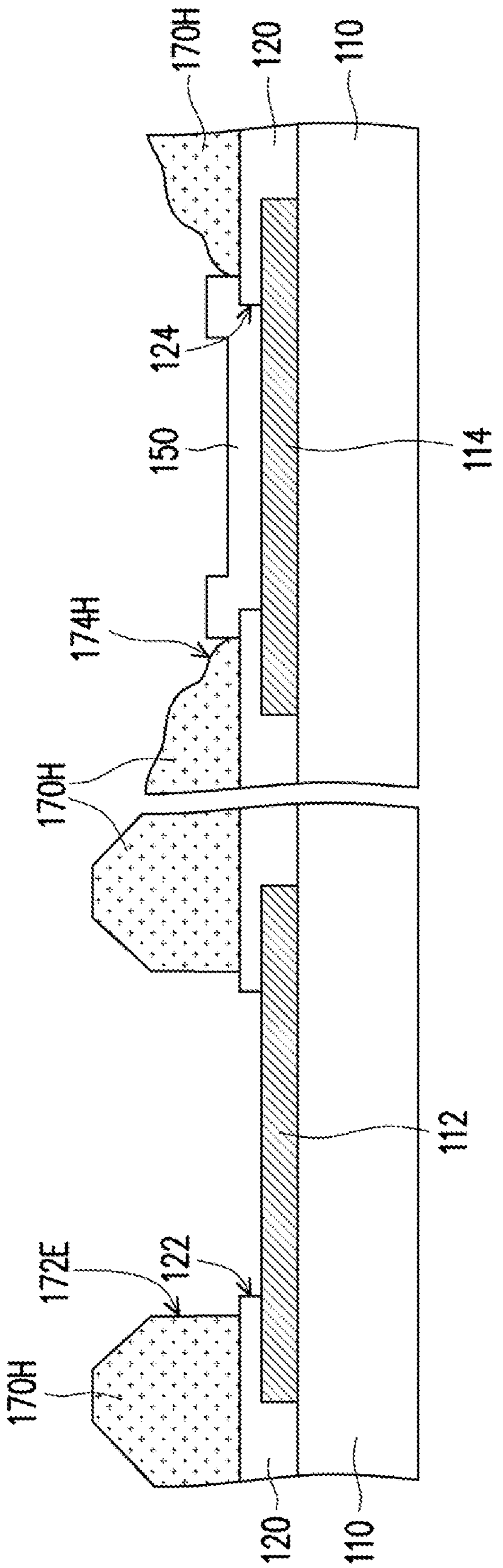
Figure 9C:
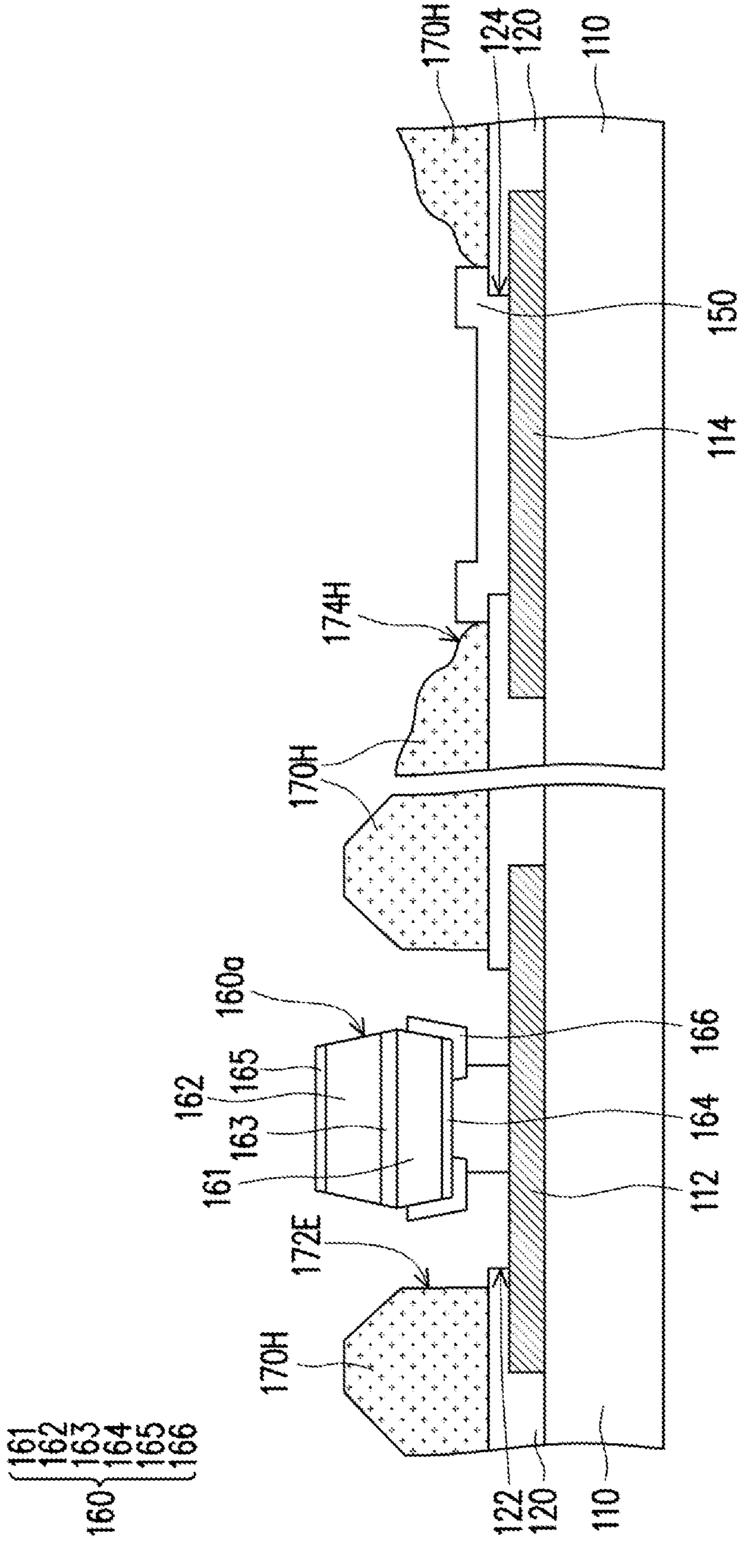
Figure 9D:
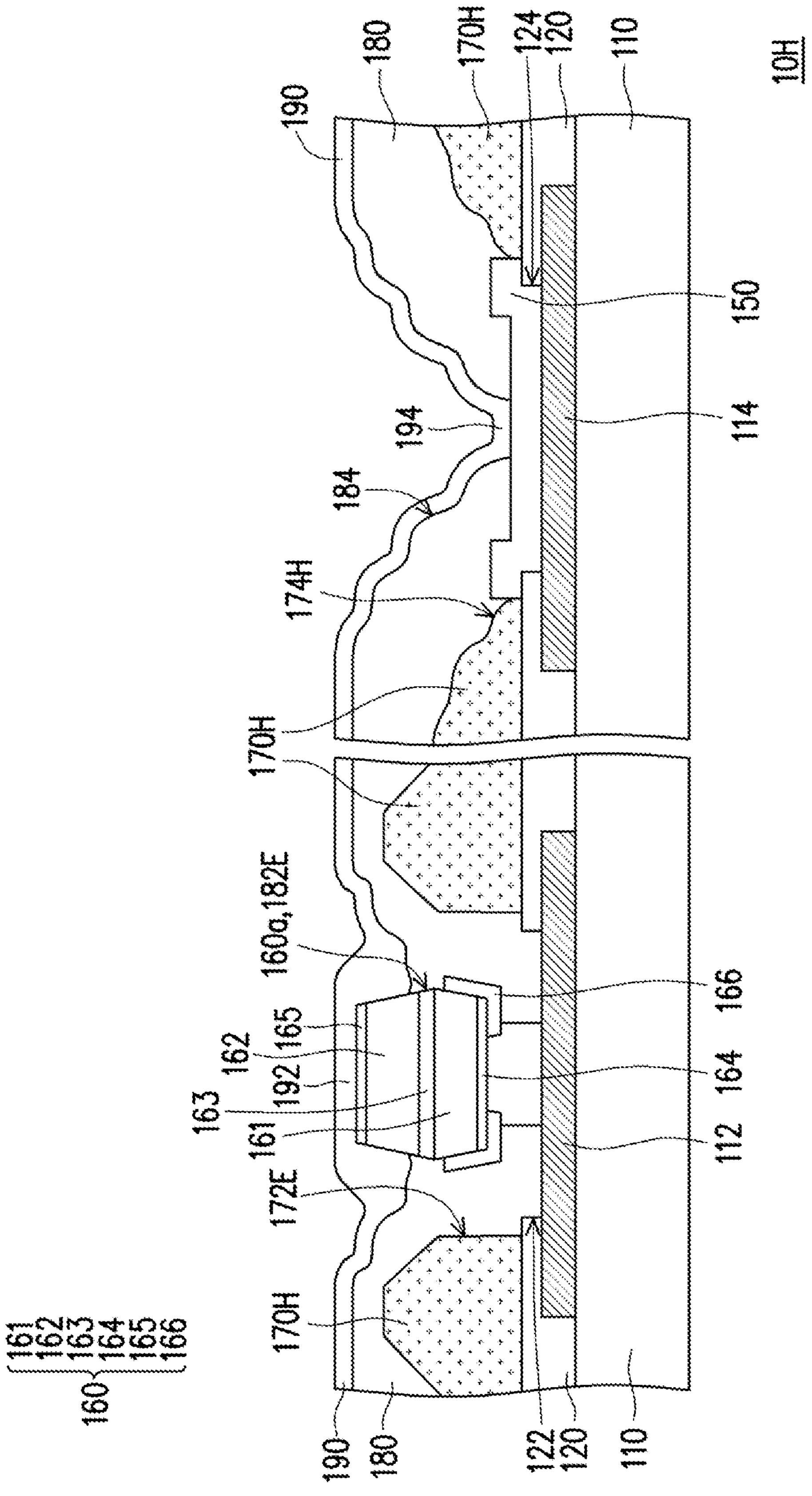

In addition, referring to FIG. 9B to FIG. 9D, in the present embodiment, the reflective structure 170H has a second opening 174H overlapping with the second pad 114, and the flat layer 180 has a second opening 184. The second opening 184 of the flat layer 180 is located in the second opening 174H of the reflective structure 170H, and the other end 194 of the bridging component 190 is filled in the second opening 184 of the flat layer 180 to be electrically connected to the second pad 114.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, comprising:

a driving backplane, having a first pad and a second pad separated from each other;

a light emitting component, having a first electrode and a second electrode, wherein the first electrode of the light emitting component is electrically connected to the first pad of the driving backplane, and the first electrode of the light emitting component is located between the second electrode of the light emitting component and the first pad of the driving backplane;

a reflective structure, disposed on the driving backplane and located at a periphery of the light emitting component; and a bridging component, disposed on the light emitting component, wherein one end of the bridging component is electrically connected to the second electrode of the light emitting component, the bridging component passes across at least one portion of the reflective structure, and the other end of the bridging component is electrically connected to the second pad of the driving backplane.

2. The display panel according to claim 1, wherein the light emitting component has a peripheral surface located between the first electrode and the second electrode, and the reflective structure is disposed on the first pad of the driving backplane and covers at least one portion of the peripheral surface of the light emitting component.

3. The display panel according to claim 2, wherein the reflective structure directly contacts the peripheral surface of the light emitting component.

4. The display panel according to claim 2, wherein the reflective structure has a first opening overlapping with the light emitting component.

5. The display panel according to claim 2, wherein the reflective structure has a surface facing away from the driving backplane, the second electrode of the light emitting component has a surface facing away from the driving backplane, a first direction is substantially perpendicular to the driving backplane, and a distance between the surface of the reflective structure and the first pad in the first direction is less than a distance between the surface of the second electrode of the light emitting component and the first pad in the first direction.

6. The display panel according to claim 2, further comprising:

an insulating layer, disposed on the driving backplane, and having a first opening overlapping with the first pad, wherein a portion of the reflective structure is disposed in the first opening of the insulating layer.

7. The display panel according to claim 6, wherein a second direction is substantially parallel to the driving backplane, and a width of the reflective structure in the second direction is greater than or equal to a width of the first opening of the insulating layer in the second direction.

8. The display panel according to claim 2, wherein the reflective structure comprises:

a main portion, disposed on the peripheral surface of the light emitting component; and an auxiliary portion, wherein the main portion has a peripheral surface located around the light emitting component, the auxiliary portion is disposed on the peripheral surface of the main portion, and a material of the main portion is different from a material of the auxiliary portion.

9. The display panel according to claim 2, further comprising:

an insulating layer, disposed on the driving backplane, and having a first opening overlapping with the first pad and a body defining the first opening, wherein the reflective structure is disposed in the first opening of the insulating layer and on the body of the insulating layer, and the bridging component is directly disposed on the reflective structure.

10. The display panel according to claim 9, wherein the reflective structure has a second opening overlapping with the second pad, and the other end of the bridging component is filled in the second opening of the reflective structure to be electrically connected to the second pad.

11. The display panel according to claim 2, further comprising:

a flat layer, wherein the reflective structure has a peripheral surface located around the light emitting component, and the flat layer covers at least one portion of the peripheral surface of the reflective structure.

12. The display panel according to claim 1, wherein the reflective structure has a first opening overlapping with the first pad and the light emitting component, and the display panel further comprises:

a flat layer, disposed on the reflective structure, and filled in the first opening of the reflective structure.

13. The display panel according to claim 12, wherein the light emitting component has a peripheral surface located between the first electrode and the second electrode, and the flat layer directly contacts the peripheral surface of the light emitting component.

14. The display panel according to claim 12, wherein the flat layer has a first opening overlapping with the light emitting component.

15. The display panel according to claim 12, further comprising:

an insulating layer, disposed on the driving backplane, and having a first opening overlapping with the first pad, wherein the reflective structure is disposed between the flat layer and the insulating layer, a second direction is substantially parallel to the driving backplane, and a width of the first opening of the reflective structure in the second direction is greater than a width of the first opening of the insulating layer in the second direction.

16. The display panel according to claim 15, wherein the reflective structure comprises:

a main portion, disposed on the insulating layer; and an auxiliary portion, wherein the main portion has a peripheral surface located around the light emitting component, the auxiliary portion is disposed on the peripheral surface of the main portion, and a material of the main portion is different from a material of the auxiliary portion.

17. The display panel according to claim 15, wherein the reflective structure has a second opening overlapping with the second pad, the flat layer has a second opening, the second opening of the flat layer is located in the second opening of the reflective structure, and the other end of the bridging component is filled in the second opening of the flat layer to be electrically connected to the second pad.

* * * * *